US005175445A

United States Patent [19]
Kinugasa et al.

[11] Patent Number: 5,175,445
[45] Date of Patent: Dec. 29, 1992

[54] MOS TYPE INPUT CIRCUIT

[75] Inventors: Masanori Kinugasa, Yokohama; Hiroshi Shigehara, Tokyo, both of Japan

[73] Assignee: Kabushiki Kaisha Toshiba, Kawasaki, Japan

[21] Appl. No.: 691,414

[22] Filed: Apr. 25, 1991

[30] Foreign Application Priority Data

Apr. 26, 1990 [JP] Japan .................. 2-108850

[51] Int. Cl.⁵ .................. H03K 17/16
[52] U.S. Cl. .................. 307/451; 307/443; 307/290
[58] Field of Search .......... 307/264, 475, 270, 450, 307/451, 452, 443, 558, 568, 542, 279, 290

[56] References Cited

U.S. PATENT DOCUMENTS

| | | | |
|---|---|---|---|
| 3,657,575 | 4/1972 | Taniguchi et al. | 307/304 |
| 4,464,587 | 8/1984 | Suzuki et al. | 307/279 |
| 4,563,594 | 1/1986 | Koyama | 307/290 |
| 4,656,373 | 4/1987 | Plus | 307/475 |
| 4,739,193 | 4/1988 | Doty, II | 307/451 X |
| 4,806,802 | 2/1989 | Okitaka et al. | 307/443 X |
| 5,034,629 | 7/1991 | Kinugasa et al. | 307/279 X |

Primary Examiner—David Hudspeth
Attorney, Agent, or Firm—Finnegan, Henderson, Farabow, Garrett and Dunner

[57] ABSTRACT

The source-drain paths of p-channel first and second MOSFETs are connected in series between a node, to which a high-potential power source voltage is supplied, and a signal output node. The source-drain paths of n-channel third and fourth MOSFETs are connected in series between the signal output node and a node to which a low-potential power source voltage is supplied. A signal from an input node is supplied to the gates of said four MOSFETs in a parallel manner. The source-drain path of an n-channel fifth MOSFET is connected in parallel to the source-drain path of the second MOSFET which is not directly connected to the node of the high-potential power source voltage. The gate of the fifth MOSFET is connected to the node of the high-potential power source voltage. The source-drain path of a p-channel sixth MOSFET is connected in parallel to the source-drain path of the third MOSFET which is not directly connected to the node of the low-potential power source voltage. The gate of the sixth MOSFET is connected to the node of the low-potential power source voltage.

21 Claims, 18 Drawing Sheets

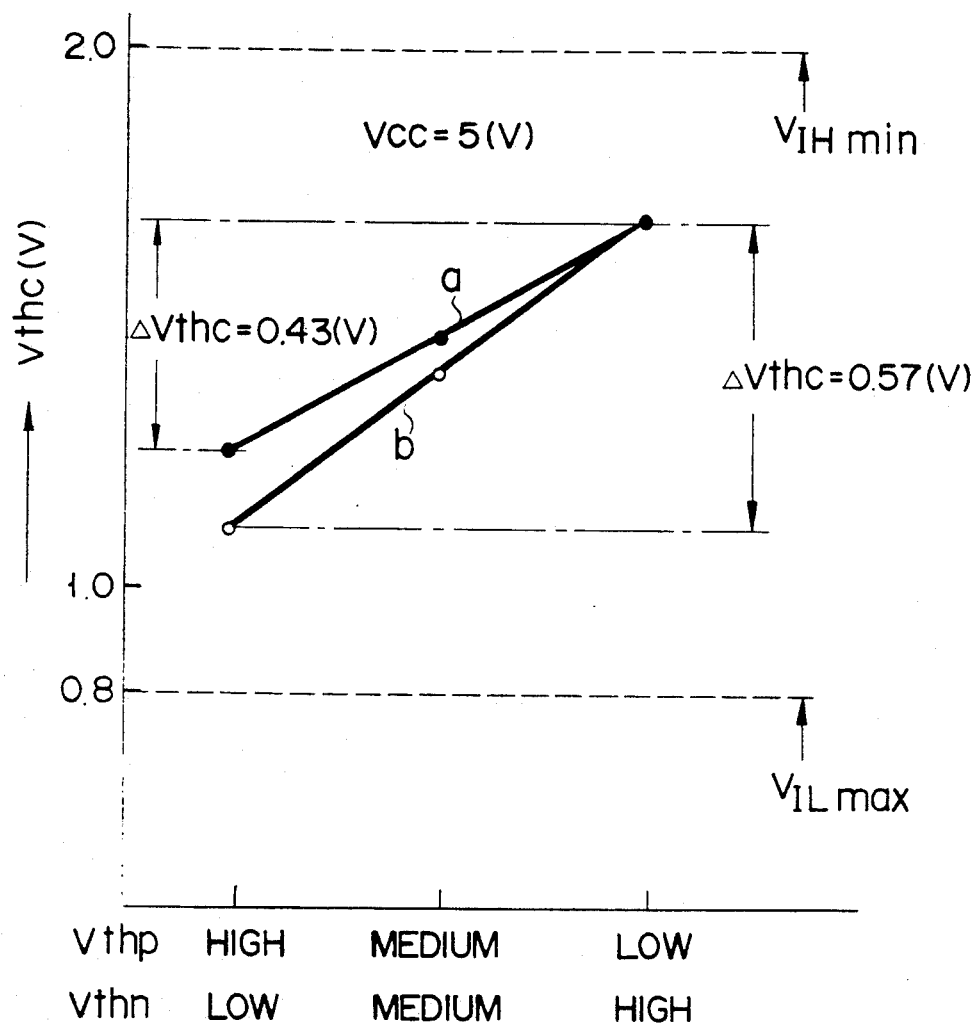
F I G. 12

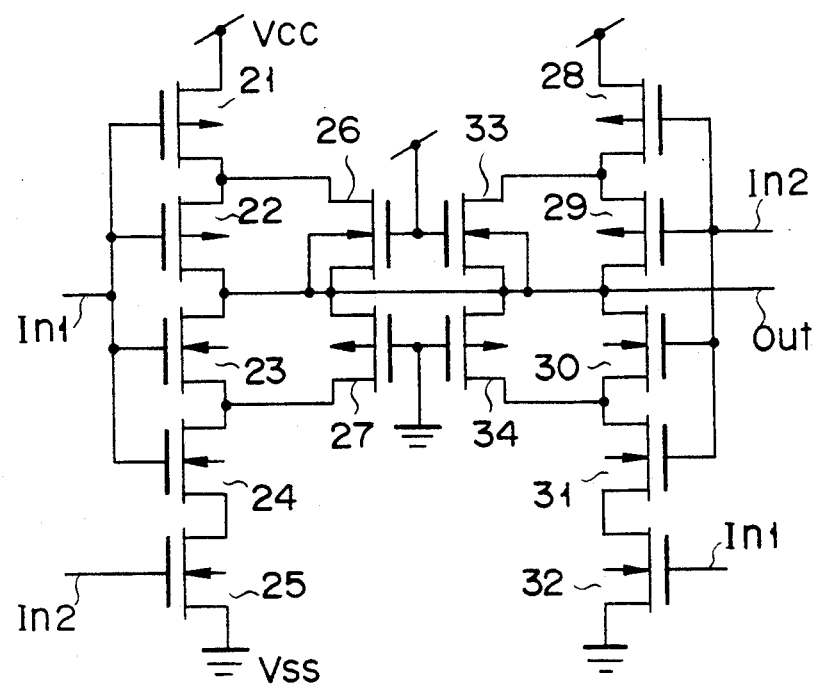
F I G. 13
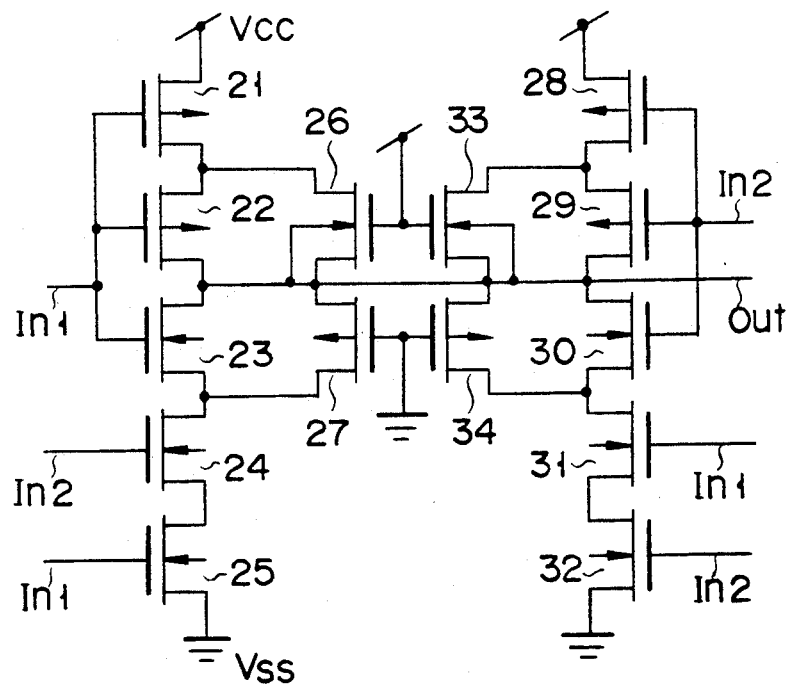
F I G. 14

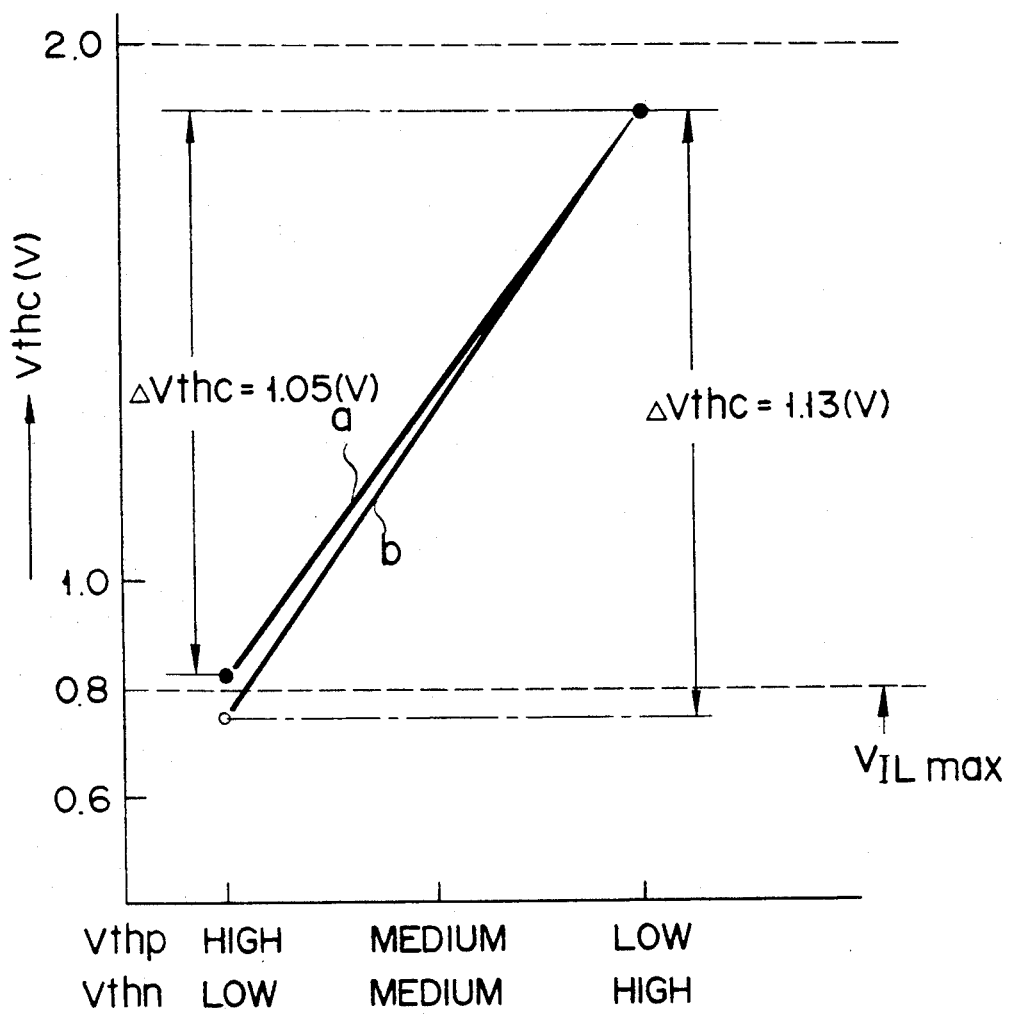
F I G. 15

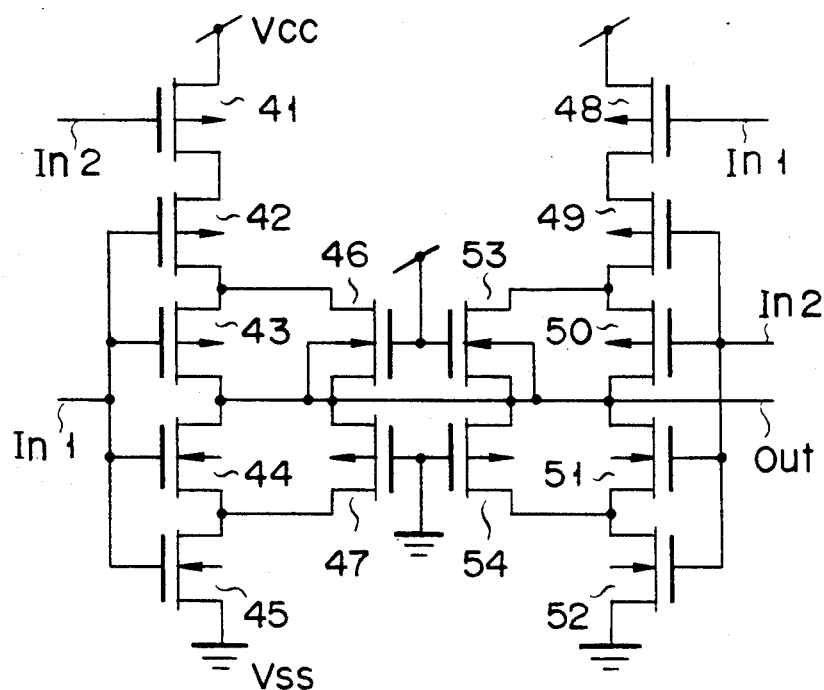
F I G. 16
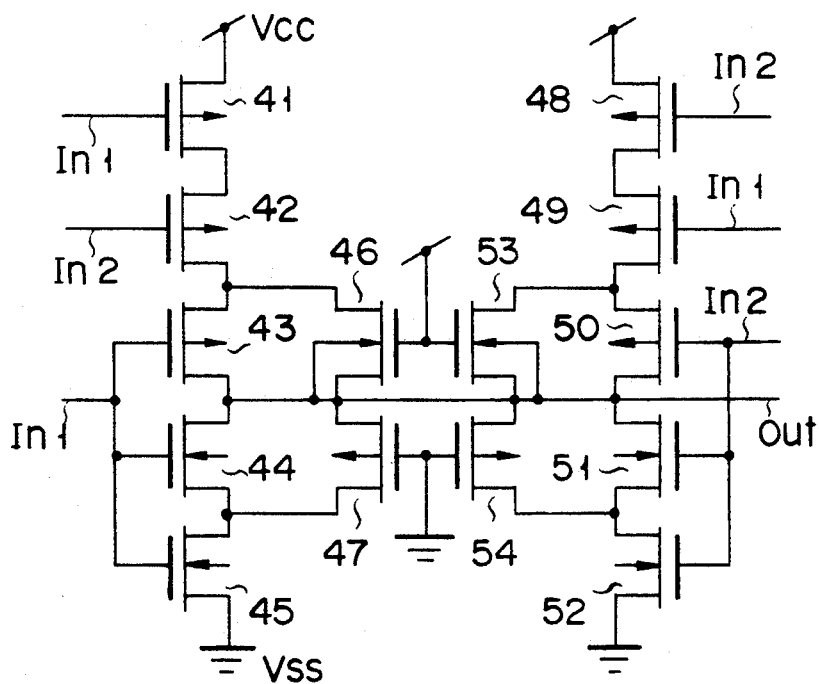
F I G. 17

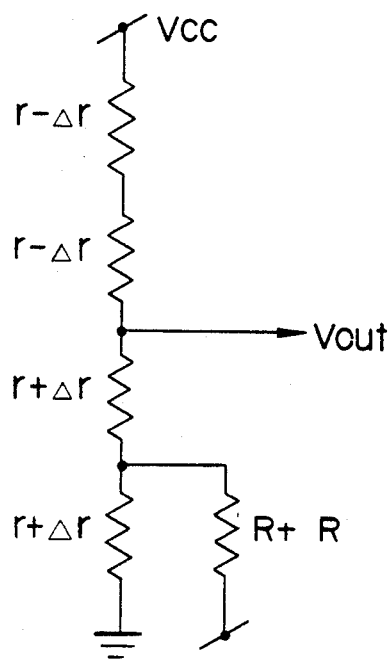
F I G. 21
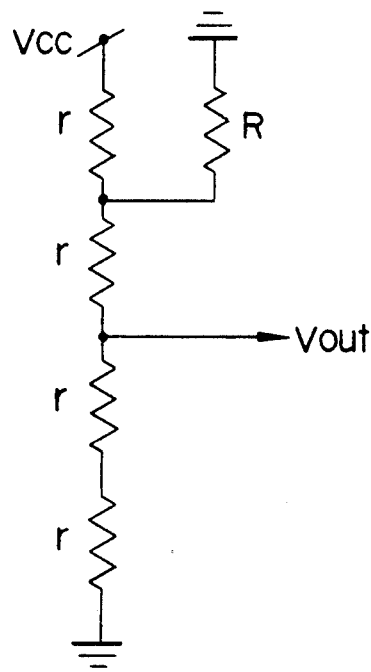
F I G. 22
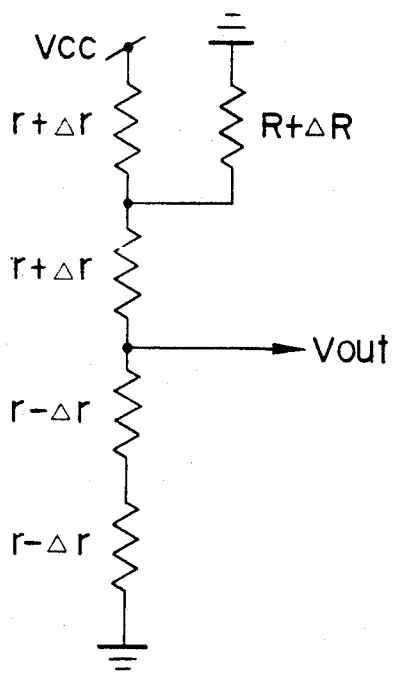
F I G. 23
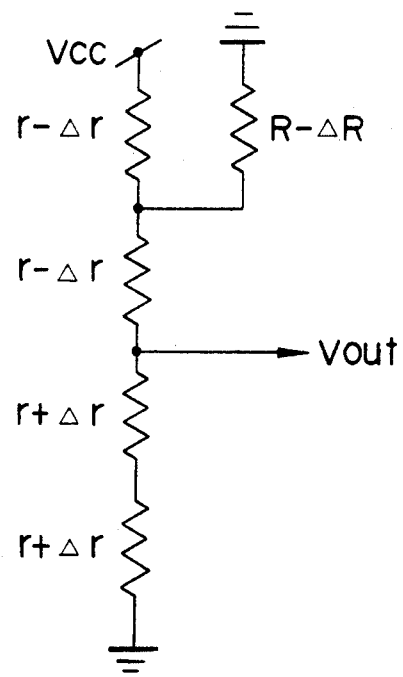
F I G. 24

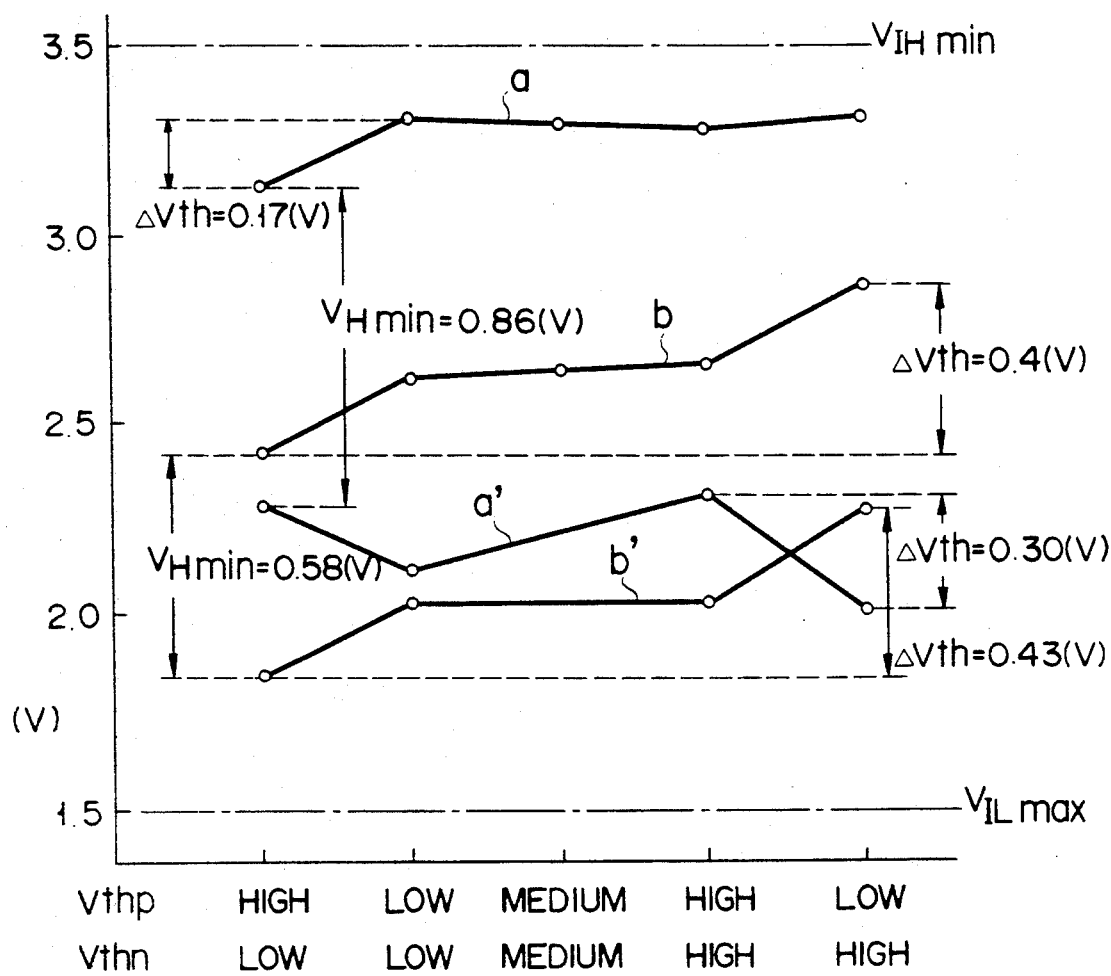
F I G. 30

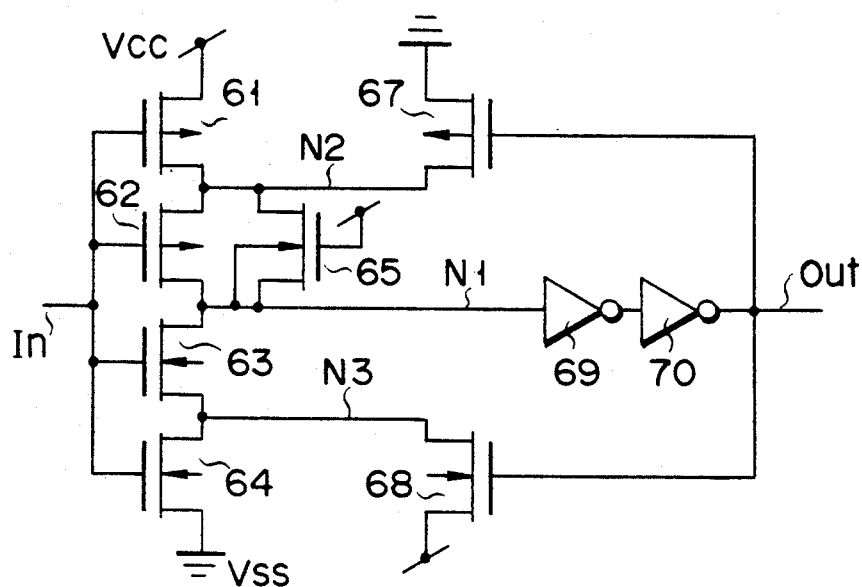
F I G. 31
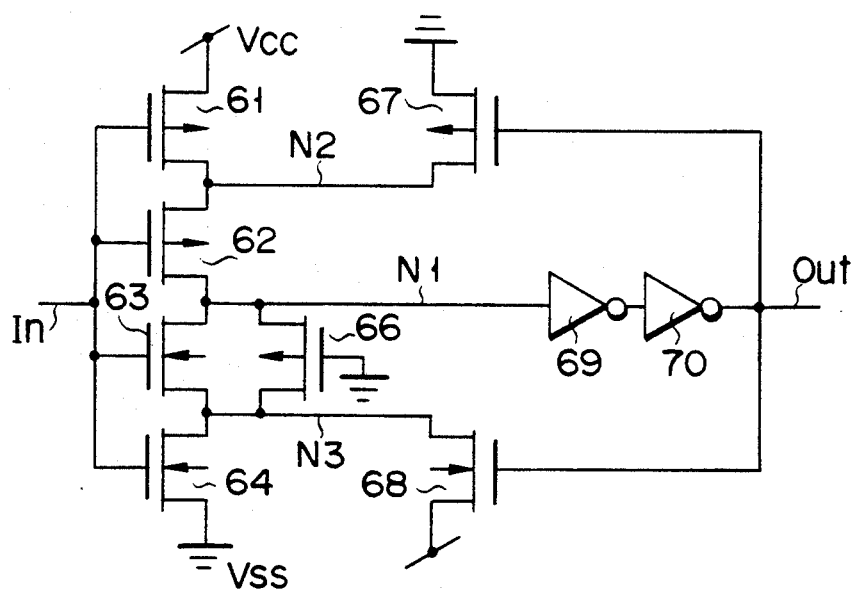
F I G. 32

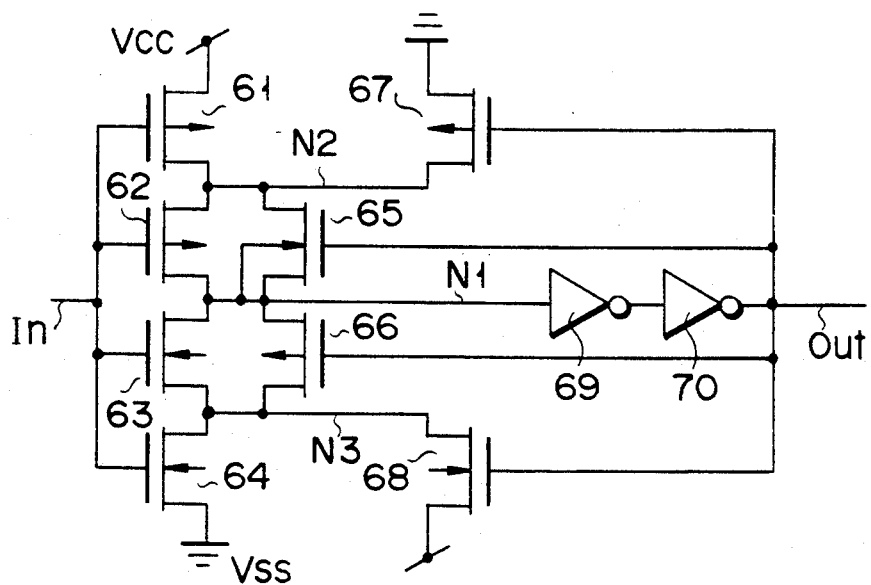
F I G. 33
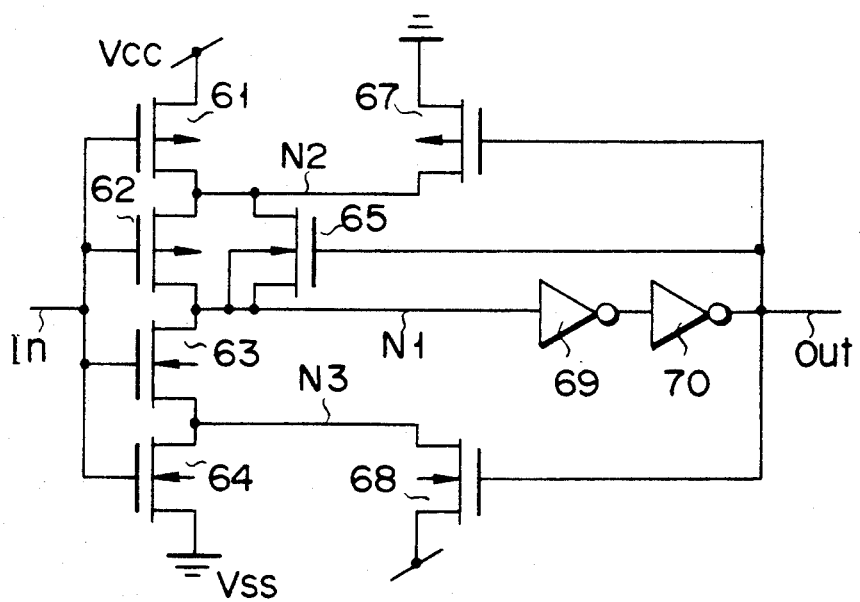
F I G. 34

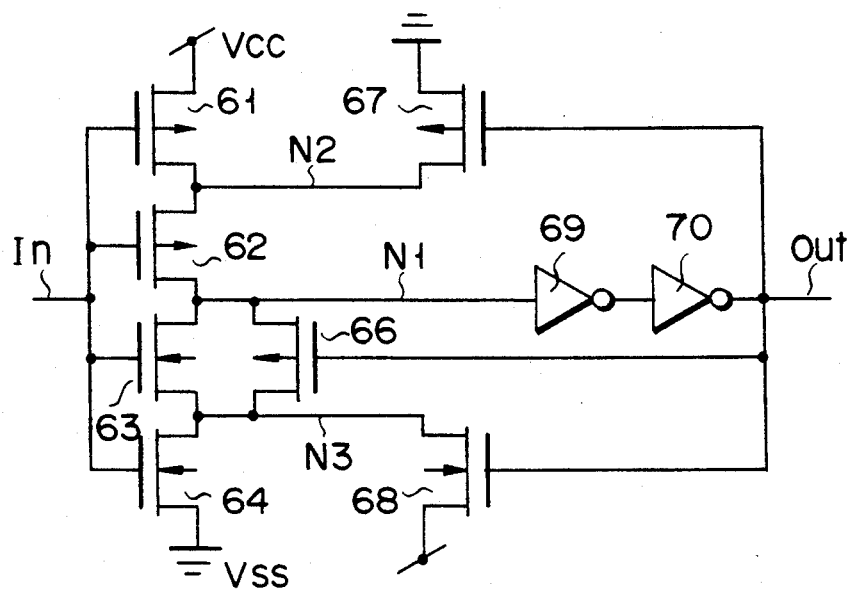
F I G. 35
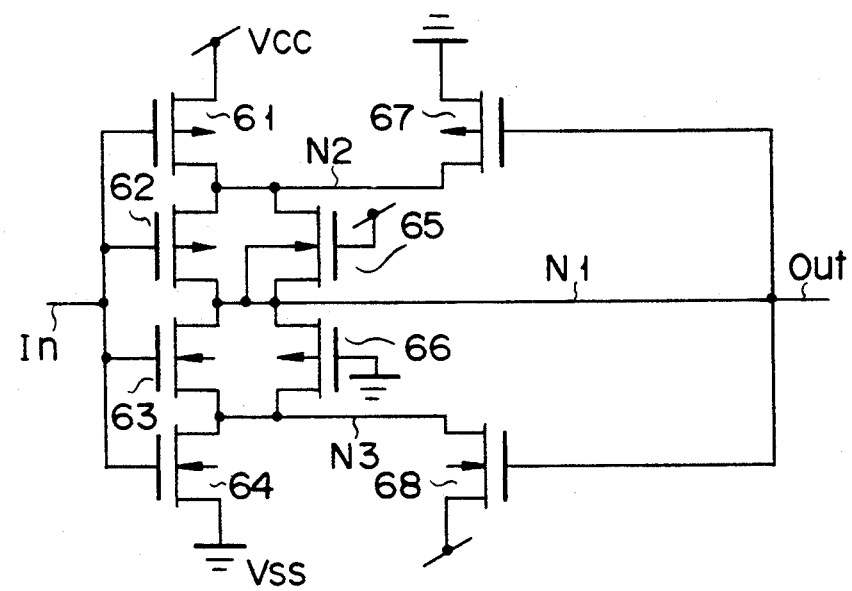
F I G. 36

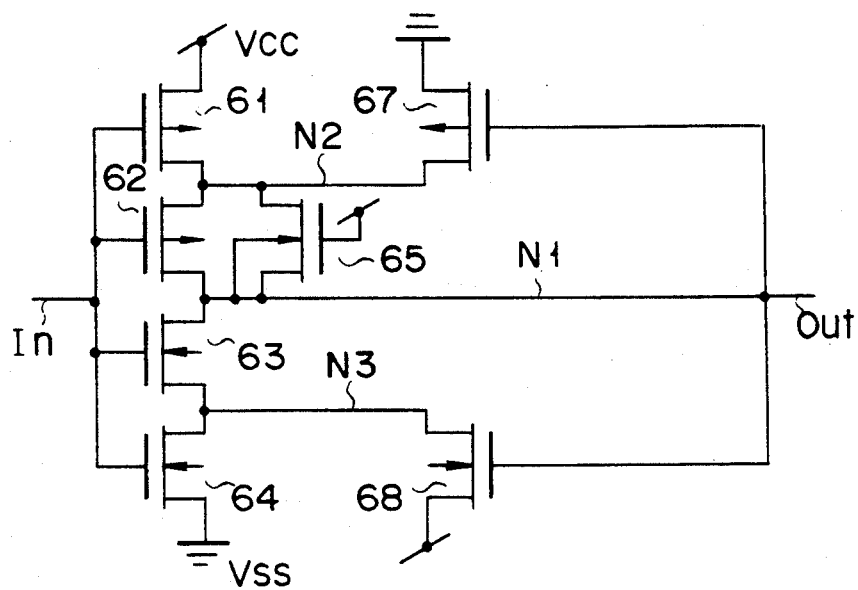
F I G. 37
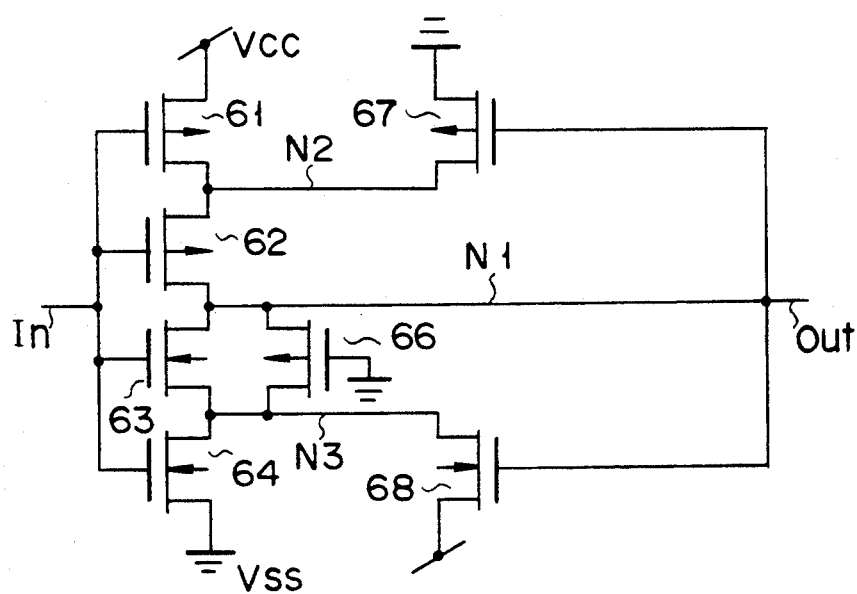
F I G. 38

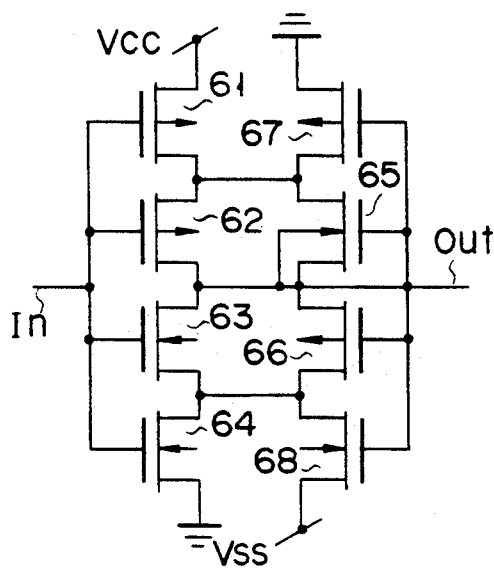
F I G. 39
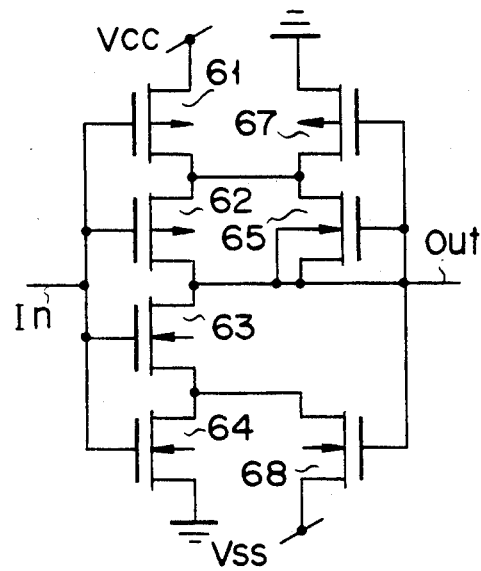
F I G. 40
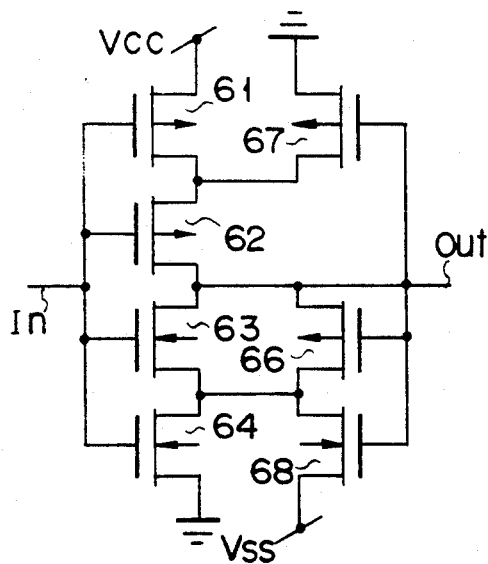
F I G. 41

MOS TYPE INPUT CIRCUIT

BACKGROUND OF THE INVENTION

1. Field of the Invention

The present invention relates to an input circuit in a semiconductor integrated circuit and, more particularly, to an input circuit comprising complementary MOS transistors.

2. Description of the Related Art

FIG. 1 shows a conventional inverter used as an input circuit in a CMOS semiconductor integrated circuit. This inverter has the following configuration. A p-channel MOSFET 71 is connected between the node of a power source voltage Vcc and an output node Out. An n-channel MOSFET 72 is connected between the output node Out and the node of a ground voltage Vss. The gates of the MOSFETs 71 and 72 are connected to an input node In.

FIG. 2 shows a conventional two-input NAND circuit used as an input circuit in a CMOS semiconductor integrated circuit. This NAND circuit has the following configuration. A p-channel FET 73 is connected between the node of a power source voltage Vcc and an output node Out. Two n-channel MOSFETs 74 and 75 are connected in series between the output node Out and the node of a ground voltage Vss. A p-channel MOSFET 76 is connected between the node of the power source voltage Vcc and the output node Out. Two n-channel MOSFETs 77 and 78 are connected in series between the output node Out and the node of the ground voltage Vss. The gates of the MOSFETs 73, 74, and 78 are commonly connected to a first input node In1. The gates of the FETs 75, 76, and 77 are commonly connected to a second input node In2.

FIG. 3 shows a conventional two-input NOR circuit used as an input circuit in a CMOS semiconductor integrated circuit. This NOR circuit has the following configuration. Two p-channel MOSFETs 79 and 80 are connected in series between the node of a power source voltage Vcc and an output node Out. An n-channel MOSFET 81 is connected between the output node Out and a ground voltage Vss. Two p-channel MOSFETs 82 and 83 are connected in series between the node of the power source voltage Vcc and the output node Out. An n-channel MOSFET 84 is connected between the output node Out and the node of the ground voltage Vss. The gates of the FETs 79 and 83 are commonly connected to a second input node In2. The gates of the FETs 80, 81, 82, and 84 are commonly connected to a first input node In1.

In an input circuit such as an inverter, a NAND circuit, and a NOR circuit comprising MOSFETs, it is known that when the threshold voltages of the MOSFETs vary, the circuit threshold voltage also varies. When a TTL-level signal is input as an input signal, the rated range of the input noise margin becomes wider than in a case when a CMOS-level signal is input as an input signal. Therefore, it is necessary to take a measurement to minimize a variation in the circuit threshold voltage.

The circuit threshold voltage of each of the conventional input circuits described above varies largely when the threshold voltages of two types of FETs, i.e., p- and n-channel MOSFETs, vary complementarily to each other. For example, FIG. 4 shows an equivalent circuit of the inverter shown in FIG. 1 of a case wherein the potential of the input node In reaches a value close to the circuit threshold voltage. In this case, assuming that the ON resistances of both p- and n-channel MOSFETs are R and are thus the same, the output potential becomes half the power source voltage Vcc.

Generally, a circuit threshold voltage VthC of an inverter as shown in FIG. 1 is expressed by the following equation (1):

$$VthC = \frac{Vcc - |Vthp| + \sqrt{\frac{\beta_N}{\beta_P}} VthN}{1 + \sqrt{\frac{\beta_N}{\beta_P}}} \quad (1)$$

where
- Vcc: power source potential;
- $\beta_P$: $\beta$ value of p-channel MOSFET;
- $\beta_N$: $\beta$ value of n-channel MOSFET;
- $|Vthp|$: threshold value (absolute value) of p-channel MOSFET; and
- VthN: threshold value of n-channel MOSFET When equation (1) is simplified by substituting a condition $\beta_P = \beta_N$, the following equation (2) is obtained:

$$VthC = \frac{Vcc - |Vthp| + VthN}{2} \quad (2)$$

From equations (1) and (2), it can be understood that the circuit threshold voltage varies when the threshold voltages of two types of MOSFETs constituting an inverter fluctuate complementarily to each other, i.e., such that $|Vthp|$ becomes larger than VthN or alternatively, $|Vthp|$ becomes smaller than VthN. In other words, when an input potential reaches a level close to the circuit threshold voltage of the inverter, the ON resistance fluctuates, resulting in a variation in circuit threshold voltage.

FIG. 5 shows an equivalent circuit of the inverter of FIG. 1 of a case wherein the ON resistance of the p-channel MOSFET is changed from R to R + ΔR and that of the n-channel MOSFET is changed from R to R − ΔR. The output potential Vout of the equivalent circuit of FIG. 5 is defined by the following equation (3):

$$Vout = \frac{Vcc}{2} - \frac{1}{2} \cdot \frac{\Delta R}{R} \cdot Vcc \quad (3)$$

FIG. 6 shows the equivalent circuit of a case wherein the ON resistance of the p-channel MOSFET is changed from R to R − ΔR and that of the n-channel MOSFET is changed from R to R + ΔR, contrary to the above case. The output potential Vout of this equivalent circuit is defined by the following equation (4):

$$Vout = \frac{Vcc}{2} + \frac{1}{2} \cdot \frac{\Delta R}{R} \cdot Vcc \quad (4)$$

In this manner, in the conventional inverter, when the threshold voltage of an FET varies, the circuit threshold voltage varies, posing a problem.

The same problem as this also arises in the NAND circuit of FIG. 2 or the NOR circuit of FIG. 3 in which p-channel and n-channel MOSFETs are connected in series between the node of the power source voltage Vcc and the node of the ground voltage Vss.

When an input signal is anticipated to be influenced by a disturbance, a Schmitt trigger circuit is usually used as an input circuit. FIG. 7 shows the configuration of a conventional Schmitt trigger circuit. This circuit has the following configuration. Two p-channel MOSFETs 91 and 92 are connected in series between the node of a power source voltage Vcc and a node N11. Two n-channel MOSFETs 93 and 94 are connected in series between the node N11 and the node of a ground voltage Vss. A signal from an input node In is supplied to the gates of the FETs 91, 92, 93, and 94. A signal appearing at the node N11 is sequentially inverted by two series-connected inverters 95 and 96 and is derived as an output signal. A p-channel MOSFET 97 is connected between a node N12 of the series-connected FETs 91 and 92 and the node of a ground voltage Vss. An n-channel MOSFET 98 is connected between a node N13 of the series-connected FETs 93 and 94 and the node of the power source voltage Vcc. An output signal from the inverter 96, i.e., a signal at an output node Out is supplied to the gates of the FETs 97 and 98.

The operation principle of this Schmitt trigger circuit will be briefly described. When the signal at the input node In is at the ground voltage Vss (to be referred to as "L" hereinafter), a potential Vb at the node N13 is set at Vcc - VthN by the FET 98. As the potential of the input signal is increased, the potential Vb is decreased. An input potential at which the FET 93 starts to be turned on is Vb' + VthN (where Vb' is a potential defined depending on the element constant of the FETs 94 and 98 and an input potential). If the FET 98 as the feedback element is not provided, the input potential at which the FET 93 starts to be turned on is VthN. When the FET 98 is added, the circuit threshold voltage upon a change in input from "L" to the level of the power source voltage Vcc (to be referred to as "H" hereinafter) is increased by Vb'.

When the input signal is "H", a potential Va at the node is set at |Vthp| by the FET 97. As the potential of the input signal is decreased, the potential Va is increased. The input potential at which the FET 92 starts to be turned on is Va' + |Vthp| (where Va' is a potential defined depending on the element constant of the FETs 91 and 97 and an input potential). When the FET 97 as a feedback element is not provided, the input potential at which the FET 92 starts to be turned on is Vcc − |Vthp|. When the FET 97 is added, the circuit threshold voltage upon a change in input from "H" to "L" is decreased by Vcc − Va'. Then, a potential difference between Vb' + VthN and Vcc − |Vthp| becomes the hysteresis voltage width.

In the conventional Schmitt trigger circuit, assume that the Schmitt characteristics are to be realized within a predetermined input margin, i.e., within a range that e.g., when the power source voltage Vcc is 2V, the minimum high-level input potential (VIHmin) is 1.5V, and the maximum low-level input potential (VILmax) is 0.5V; when the power source voltage Vcc is 5V, VIHmin is 3.5V and VILmax is 1.5V, while setting a hysteresis voltage width as wide as possible. Then, the actual characteristics are largely restricted by the influence of the variation in the threshold voltages of the FET, especially under a low power source voltage. In other words, when the power source voltage is 5V, a sufficient input noise margin is assured. Nevertheless, if the hysteresis voltage width is set larger than the rated margin, the Schmitt characteristics undesirably fall outside the rated margin when Vcc is 2V.

As described above, in the conventional inverter, NAND circuit, NOR circuit, or Schmitt trigger circuit used as the input circuit in the conventional CMOS semiconductor integrated circuit, when the threshold voltage of a transistor varies, the circuit threshold voltage also greatly varies. In particular, in a Schmitt trigger circuit, due to the influence of the variation in the circuit threshold voltage, the hysteresis voltage width at a low power source voltage cannot be increased.

SUMMARY OF THE INVENTION

The present invention has been made in view of the above situation, and has as its object to provide a MOS type input circuit in which a variation in circuit threshold voltage with respect to a variation in threshold voltage of an FET can be suppressed more than in a conventional case.

According to the present invention, there is provided a CMOS type input circuit comprising: a first node for receiving a first power source voltage; a second node for receiving a second power source voltage; a third node for outputting a signal; a first MOSFET of a first channel type having a gate, a source, a drain, and a source-drain path, one end of which is connected to the first node; a second MOSFET of the first channel type having a gate, source, a source, and a source-drain path, one end of which is connected to the other end of the source-drain path of the first MOSFET, and the other end of which is connected to the third node; a third MOSFET of a second channel type having a gate, a source, a drain, and a source-drain path, one end of which is connected to the second node; a fourth MOSFET of the second channel type having a gate, a source, a drain, and a source-drain path, one end of which is connected to the other end of the source-drain path of the third MOSFET, and the other end of which is connected to the third node; and a fifth MOSFET of the second channel type having a gate, a source, a drain, and a source-drain path which is connected in parallel to the source-drain path of the second MOSFET.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11 and 12 are graphs used for explaining the circuit of FIG. 8;

FIG. 13 is a circuit diagram of a CMOS type NAND circuit according to the second embodiment of the present invention;

FIG. 14 is a circuit diagram of a CMOS type NAND circuit according to the third embodiment of the present invention;

FIG. 15 is a graph of the circuits shown in FIGS. 13 and 14;

FIG. 16 is the circuit diagram of a CMOS type NOR circuit according to the fourth embodiment of the present invention;

FIG. 17 is a circuit diagram of a CMOS type NAND circuit according to the fifth embodiment of the present invention;

FIGS. 19 to 24 are equivalent circuit diagrams of the conventional CMOS type Schmitt trigger circuit shown in FIG. 7;

FIGS. 29 and 30 are graphs of the CMOS type Schmitt trigger circuit shown in FIG. 18;

FIG. 31 is a circuit diagram of a CMOS type Schmitt trigger circuit according to the seventh embodiment of the present invention;

FIG. 32 is a circuit diagram of a CMOS type Schmitt trigger circuit according to the eighth embodiment of the present invention;

FIG. 33 is a circuit diagram of a CMOS type Schmitt trigger circuit according to the ninth embodiment of the present invention;

FIG. 34 is a circuit diagram of a CMOS type Schmitt trigger circuit according to the tenth embodiment of the present invention;

FIG. 35 is a circuit diagram of a CMOS type Schmitt trigger circuit according to the eleventh embodiment of the present invention;

FIG. 36 is a circuit diagram of a CMOS type Schmitt trigger circuit according to the twelfth embodiment of the present invention;

FIG. 37 is a circuit diagram of a CMOS type Schmitt trigger circuit according to the thirteenth embodiment of the present invention;

FIG. 38 is a circuit diagram of a CMOS type Schmitt trigger circuit according to the fourteenth embodiment of the present invention;

FIG. 39 is a circuit diagram of a CMOS type Schmitt trigger circuit according to the fifteenth embodiment of the present invention;

FIG. 40 is a circuit diagram of a CMOS type Schmitt trigger circuit according to the sixteenth embodiment of the present invention; and FIG. 41 is a circuit diagram of a CMOS type Schmitt trigger circuit according to the seventeenth embodiment of the present invention.

DETAILED DESCRIPTION OF THE PREFERRED EMBODIMENTS

The preferred embodiments of the present invention will be described with reference to the accompanying drawings.

Figure 8:
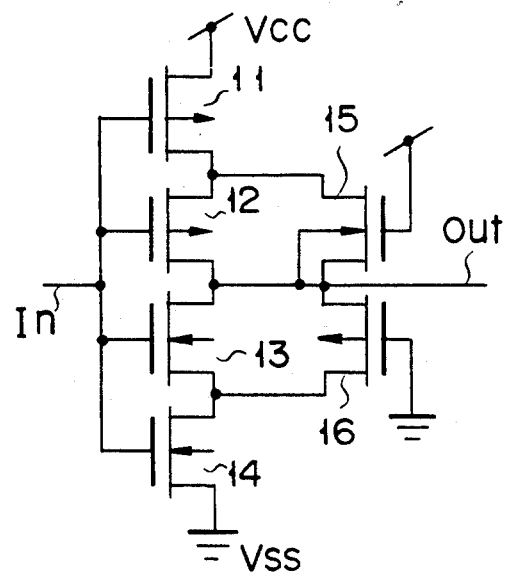
FIG. 8 is a circuit diagram of a CMOS type inverter according to the first embodiment of the present invention.

FIG. 8 is a circuit diagram of the first embodiment of the present invention in which the CMOS type input circuit of the present invention is applied to an inverter. The source-drain paths of two p-channel MOSFETs 11 and 12 are connected in series between a node, to which a power source voltage Vcc is supplied, and an output node Out. The source-drain paths of two n-channel MOSFETs 13 and 14 are connected in series between the output node Out and a node to which a ground voltage Vss is supplied. The gates of the FETs 11, 12, 13, and 14 are commonly connected to an input node In. The source-drain path of an n-channel MOSFET 15 is connected in parallel to that of the FET 12. The gate of the FET 15 is connected to the node of the power source voltage Vcc. The source-drain path of a p-channel MOSFET 16 is connected in parallel to that of the FET 13. The gate of the FET 16 is connected to the node of the ground voltage Vss.

More specifically, this inverter has the following configuration. The n-channel MOSFET 15 is connected in parallel to the p-channel MOSFET 12. An input signal is supplied to the gate of the MOSFET 12. The gate of the MOSFET 15 is connected to the node of the power source voltage Vcc so that the MOSFET 15 can be turned on. The p-channel MOSFET 16 is connected in parallel to the n-channel MOSFET 13. The input signal is supplied to the gate of the MOSFET 13. The gate of the MOSFET 16 is connected to the node of the ground voltage Vss so that the MOSFET 16 can be turned on.

In the inverter having the above configuration, when a signal at the input node In is "L", the p-channel FETs 11 and 12 are turned on, and thus a signal at the output node Out becomes "H". On the other hand, when the signal at the input node In is "H", the n-channel FETs 13 and 14 are turned on, and thus the signal at the output node Out becomes "L". Thus, this circuit serves as an inverter for inverting an input signal.

Figure 9:
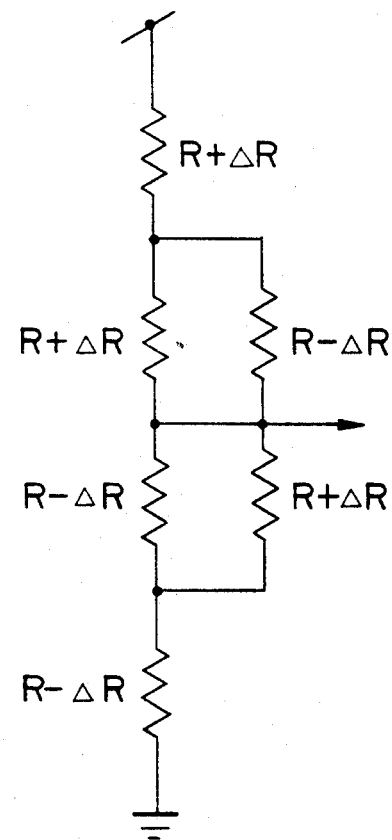
FIG. 9 is an equivalent circuit diagram of the circuit shown in FIG. 8.

In this circuit, a case wherein the threshold voltages of the p- and n-channel FETs vary will be considered. As described above, when the input potential reaches a value close to the circuit threshold voltage of the inverter, the ON resistances of the respective FETs vary, and thus the circuit threshold voltage varies. FIG. 9 shows an equivalent circuit diagram of a case wherein the input potential reaches a value close to the circuit threshold voltage of the inverter, the ON resistances of the respective p-channel MOSFETs are changed from R to R + ΔR, and the ON resistances of the respective n-channel MOSFETs are changed from R to R − ΔR. The output potential Vout of the equivalent circuit of FIG. 9 can be defined by the following equation (5):

$$V_{out} = \frac{\frac{(R + \Delta R)(R - \Delta R)}{(R + \Delta R) + (R - \Delta R)} + (R - \Delta R)}{(R + \Delta R) + \frac{(R + \Delta R)(R - \Delta R)}{(R + \Delta R) + (R - \Delta R)} + \frac{(R + \Delta R)(R - \Delta R)}{(R + \Delta R) + (R - \Delta R)} + (R - \Delta R)} \quad (5)$$

$$V_{cc} = \frac{R + R' - \Delta R}{2R + 2R'} \cdot V_{cc} = \frac{V_{cc}}{2} - \frac{1}{2} \cdot \frac{\Delta R}{R + R'} \cdot V_{cc}$$

for $$R' = \frac{(R + \Delta R)(R - \Delta R)}{(R + \Delta R) + (R - \Delta R)}$$

Figure 10:
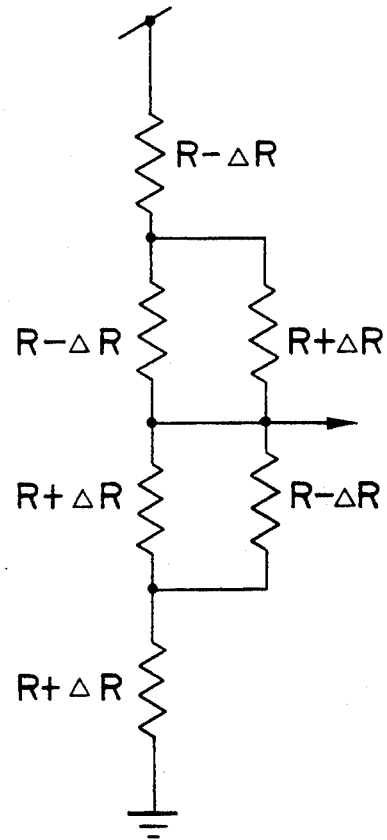
FIG. 10 is an equivalent circuit diagram of the circuit shown in FIG. 8.

FIG. 10 shows the equivalent circuit of a case wherein, opposite to the above case, the ON resistances of the p-channel MOSFETs are changed from R to R − ΔR and that of the n-channel MOSFETs are changed from R to R + ΔR. The output potential Vout of the equivalent circuit of FIG. 10 is defined by the following equation (6):

$$V_{out} = \frac{V_{cc}}{2} + \frac{1}{2} \cdot \frac{\Delta R}{R + R'} \cdot V_{cc} \quad (6)$$

Equations (3) and (4) of the conventional circuit and equations (5) and (6) of the circuit of this embodiment are compared with each other. It is understood that variations in output potential are more suppressed in the circuit of this embodiment than in the conventional circuit. In other words, the variations in ON resistances of the FETs are suppressed, and thus an effect to suppress the variation in circuit threshold voltage can be obtained.

Figure 1:
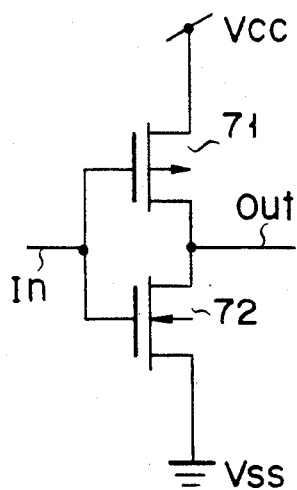
FIG. 1 is a circuit diagram of a conventional CMOS type inverter.
Figure 11:
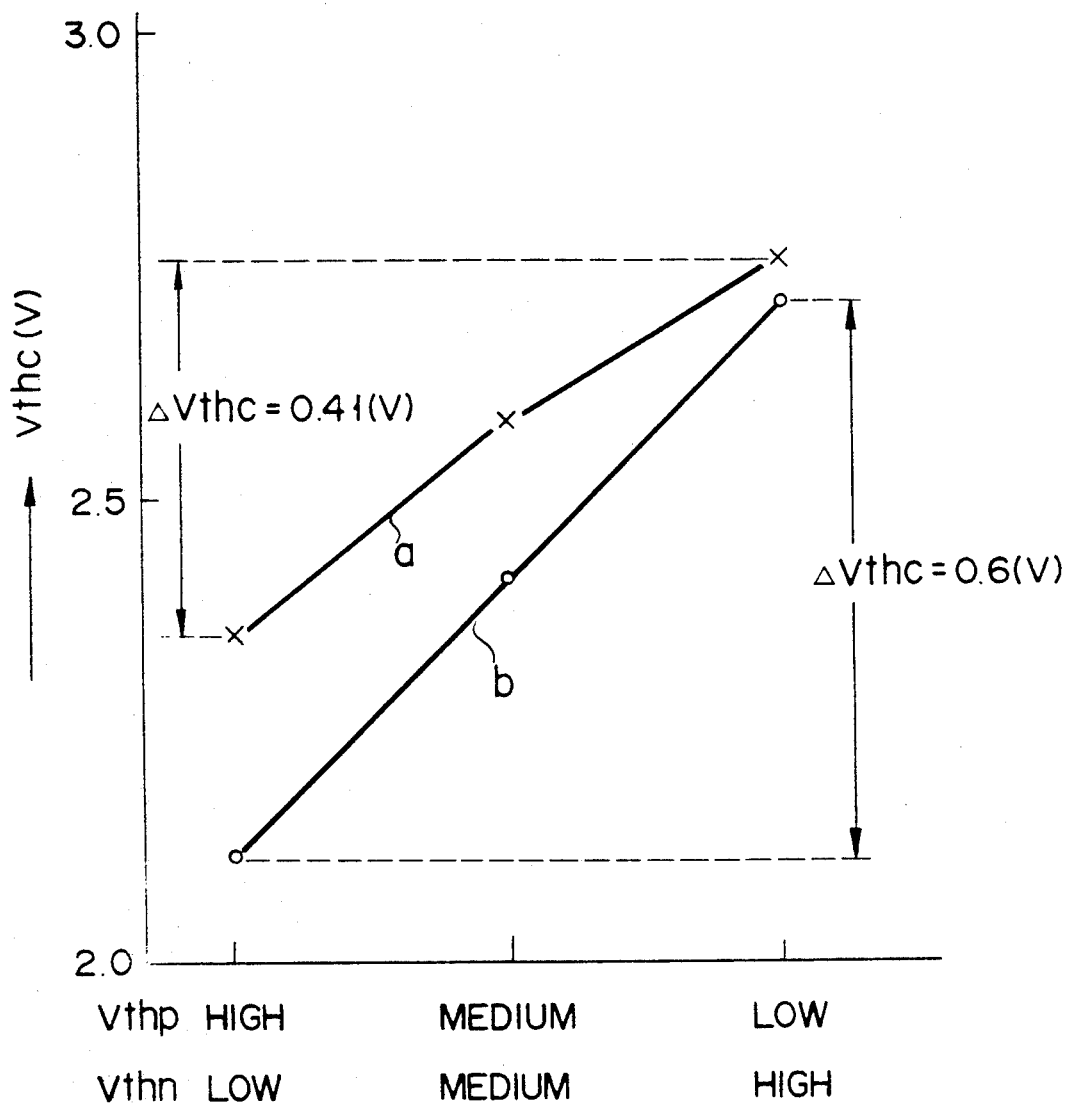

FIG. 11 is a graph showing a change in a circuit threshold voltage VthC, of the inverter of the first embodiment of the present invention and the conventional inverter shown in FIG. 1, wherein a threshold voltage VthP of a p-channel MOSFET and a threshold voltage VthN of an n-channel MOSFET are changed. A characteristic curve a represents the value of the circuit of the first embodiment, and a characteristic curve b represents the value of the conventional circuit. As shown in FIG. 11, in the conventional circuit, a difference in the circuit threshold voltage between a high voltage VthP and a low voltage VthN, i.e., a variation ΔVthC, is 0.6V. In contrast to this, in the circuit of the first embodiment of the present invention, a variation ΔVthC can be suppressed to 0.41V.

FIG. 12 is a graph showing variation characteristics of the circuit threshold voltage of the conventional circuit and the circuit of the first embodiment of the present invention, wherein the circuit threshold voltage is decreased to receive a TTL input. A characteristic curve a represents a value of the circuit of the first embodiment of the present invention, and a characteristic curve b represents a value of the conventional circuit. Note that in this case the power source voltage Vcc is 5V. As shown in FIG. 12, the variation ΔVthC is 0.57V in the circuit threshold voltage in the conventional circuit, whereas it is suppressed to 0.43V in the circuit of the first embodiment of the present invention. The minimum high-level input potential (VIHmin) and the maximum low-level input potential (VILmax) of the TTL circuit of this case are 2.0V and 0.8V, respectively. In the case of the circuit of the first embodiment of the present invention, the variation ΔVthC sufficiently falls within the range defined by the VIHmin and VILmax and thus has a sufficient power source margin.

FIG. 13 is the circuit diagram of the second embodiment of the present invention in which the input circuit of the present invention is applied to a two-input NAND circuit. The source-drain paths of two p-channel MOSFETs 21 and 22 are connected in series between the node of a power source voltage Vcc and an output node Out. The source-drain paths of three n-channel MOSFETs 23, 24, and 25 are connected in series between the output node Out and the node of a ground voltage Vss. The gates of the FETs 21, 22, 23, and 24 are commonly connected to a first input node In1, and the gate of the FET 25 is connected to a second input node In2. The source-drain path of an n-channel MOSFET 26 is connected in parallel to that of the FET 22. The gate of the FET 26 is connected to the node of the power source voltage Vcc. The source-drain path of a p-channel MOSFET 27 is connected in parallel to that of the FET 23. The gate of the FET 27 is connected to the node of the ground voltage Vss. The source-drain paths of two p-channel MOSFETs 28 and 29 are connected in series between the node of the power source voltage Vcc and the output node Out. The source-drain paths of three n-channel MOSFETs 30, 31, and 32 are connected in series between the output node Out and the node of the ground voltage Vss. The gates of the FETs 28, 29, 30, and 31 are commonly connected to the second input node In2, and the gate of the FET 32 is connected to the first input node In1. The source-drain path of an n-channel MOSFET 33 is connected in parallel to that of the FET 29. The gate of the FET 33 is connected to the node of the power source voltage Vcc. The source-drain path of a p-channel MOSFET 34 is connected in parallel to that of the FET 30, and the gate of the FET 34 is connected to the node of the ground voltage Vss.

In the NAND circuit according to the second embodiment of the present invention, when both signals at the first and second input nodes In1 and In2 are "H", the FETs 23, 24, and 25 are turned on, and the FETs 30, 31, and 32 are turned on. Accordingly, a signal at the output node Out becomes "L". When one or both of signals at the first and second input nodes In1 and In2 are "L", one pair or both pairs of the FETs 21 and 22, and the FETs 28 and 29 are turned on, and the signal at the output node Out becomes "H".

The n-channel FET 26 is connected in parallel to the p-channel FET 22, and the p-channel FET 27 is connected in parallel to the n-channel FET 23. The n-channel FET 33 is connected in parallel to the p-channel FET 29, and the p-channel FET 34 is connected in parallel to the n-channel FET 30. As a result, the variations in ON resistance of a FET can be suppressed, as in the case of the inverter according to the first embodiment of the present invention, and the variation in circuit threshold voltage can be suppressed.

FIG. 14 is a circuit diagram of the third embodiment of the present invention in which the input circuit of the present invention is applied to a two-input NAND circuit. The circuit of the third embodiment is different from the circuit of the second embodiment in the following respects. The gate of the FET 24 is connected to the second input node In2 in place of the first input node In1. The gate of the FET 25 is connected to the first input node In1 in place of the second input node In2. The gate of the FET 31 is connected to the first input node In1 in place of the second input node In2. The gate of the FET 32 is connected to the second input node In2 in place of the first input node In1.

In the third embodiment as well, the FETs 26, 27, 33, and 34 of conductivity types opposite to those of the FETs 22, 23, 29, and 30 are connected to the FETs 22, 23, 29, and 30, respectively. As a result, a variation in ON resistance of a FET is suppressed, and thus a variation in circuit threshold voltage can be suppressed.

Figure 2:
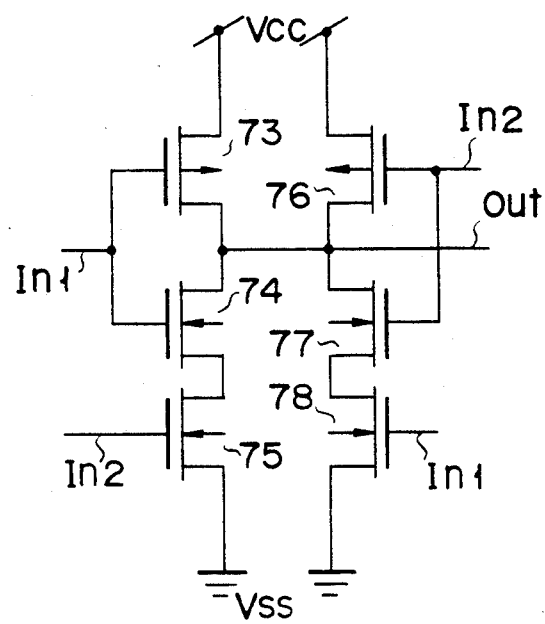
FIG. 2 is a circuit diagram of a conventional CMOS type NAND circuit.
Figure 3:
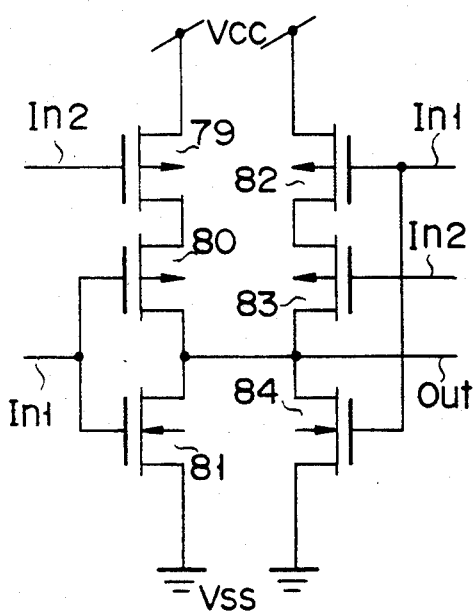
FIG. 3 is a circuit diagram of a conventional CMOS type NOR circuit.
Figure 4:
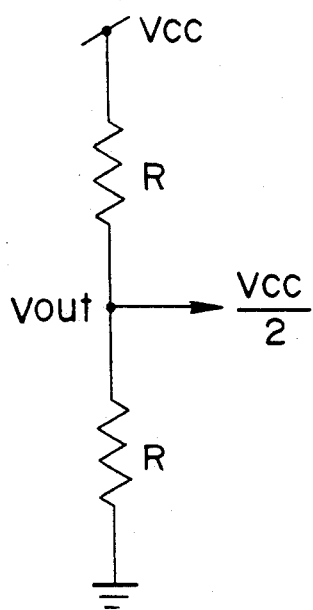
FIG. 4 is an equivalent circuit diagram of the CMOS type inverter shown in FIG. 1.
Figure 5:
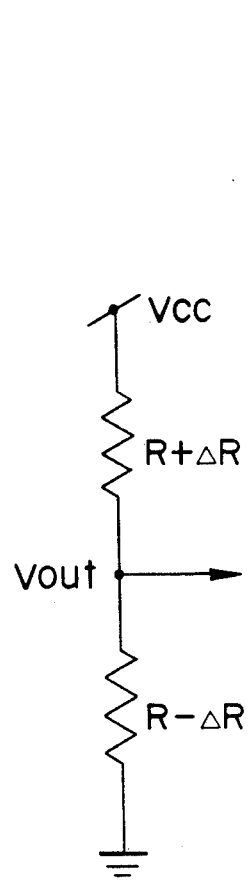
FIG. 5 is an equivalent circuit diagram of the CMOS type inverter shown in FIG. 1.
Figure 6:
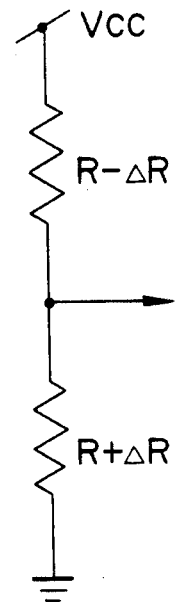
FIG. 6 is an equivalent circuit diagram of the CMOS type inverter shown in FIG. 1.

FIG. 15 is a graph of variation characteristics of the circuit threshold voltage of the conventional NAND circuit shown in FIG. 2 and the NAND circuit according to the second and third embodiments of the present invention, in which the circuit threshold voltage is decreased to receive a TTL input. A characteristic curve a represents the value of the circuit of the second and third embodiment, and a characteristic curve b represents the value of the conventional circuit. Note that the power source voltage Vcc in this case is 5V. As shown in FIG. 15, the variation $\Delta$VthC in circuit threshold voltage of the conventional circuit is 1.13V, which falls outside the range defined by the minimum high-level input potential (VIHmin) of 2.0V and the maximum low-level input potential (VILmax) of 0.8V of a TTL circuit. In contrast to this, in the circuit of the second and third embodiments, the variation $\Delta$VthC is 1.05V and falls within the range of VIHmin and VILmax.

FIG. 16 is a circuit diagram of the fourth embodiment of the present invention in which the input circuit of the present invention is applied to a two-input NOR circuit. The source-drain paths of three p-channel MOSFETs 41, 42, and 43 are connected in series between the node of a power source voltage Vcc and an output node Out. The source-drain paths of two n-channel MOSFETs 44 and 45 are connected in series between the output node Out and a node Vss of the ground voltage. The gate of the FET 42 is connected to a second input node In2, and the gates of the FETs 41, 43, 44, and 45 are commonly connected to a first input node In1. The source-drain path of an n-channel MOSFET 46 is connected in parallel to that of the FET 43. The gate of the FET 46 is connected to the node of the power source voltage Vcc. The source-drain path of a p-channel MOSFET 47 is connected in parallel to that of the FET 44. The gate of the FET 47 is connected to the node of the ground voltage Vss. The source-drain paths of three p-channel MOSFETs 48, 49, and 50 are connected in series between the node of the power source voltage Vcc and the output node Out. The source-drain paths of two n-channel MOSFETs 51 and 52 are connected in series between the output node Out and the node of the ground voltage Vss. The gate of the FET 48 is connected to the first input node In1, and the gates of the FETs 49, 50, 51, and 52 are commonly connected to the second input node In2. The source-drain path of an n-channel MOSFET 53 is connected in parallel to that of the FE 50. The gate of the FET 53 is connected to the node of the power source voltage Vcc. The source-drain path of a p-channel MOSFET 54 is connected in parallel to that of the FET 51. The gate of the FET 54 is connected to the node of the ground voltage Vss.

In the NOR circuit of the fourth embodiment, when both signals at the first and second input nodes In1 and In2 are "L", the FETs 41, 42, and 43 are turned on, and the FETs 48, 49, and 50 are turned on. Thus, the signal at the output node Out becomes "H". When either the signal at the first input node In1 or the signal at the second input node In2 is "H", one pair or both pairs of the FETs 44 and 45, and the FETs 51 and 52 are turned on, and the signal at the output node Out becomes "L".

The n-channel FET 46 is connected in parallel to the p-channel FET 43, and the p-channel FET 47 is connected in parallel to the n-channel FET 44. The n-channel FET 53 is connected in parallel to the p-channel FET 50, and the p-channel FET 54 is connected in parallel to the n-channel FET 51. Therefore, as in the case of the inverter of the first embodiment, the variation in ON resistance of an FET is suppressed, and thus the variation in circuit threshold voltage can be suppressed.

FIG. 17 is a circuit diagram of the fifth embodiment of the present invention in which the input circuit of the present invention is applied to a two-input NOR circuit. The circuit of the fifth embodiment is different from that of the fourth embodiment shown in FIG. 16 in the following respects. The gate of the FET 41 is connected to the first input node In1 in place of the second input node In2. The gate of the FET 42 is connected to the second input node In2 in place of the first input node In1. The gate of the FET 48 is connected to the second input node In2 in place of the first input node In1. The gate of the FET 49 is connected to the first input node In1 in place of the second input node In2.

In the circuit of the fifth embodiment as well, the FETs 46, 47, 53, and 54 of conductivity types opposite to those of the FETs 43, 44, 50, and 51 are connected to the FETs 43, 44, 50, and 51, respectively. As a result, a variation in ON resistance of an FET is absorbed, and thus a variation in circuit threshold voltage can be suppressed.

The NAND circuit shown in FIG. 13 or 14, or the NOR circuit shown in FIG. 16 or 17 is often used as an inverter by fixing the signal at either the first or second input node In1 or In2 at "H" or "L". In this case, either a pair of the FETs 26 and 27, or the FETs 33 and 34 can be omitted if the NAND circuit is concerned. More specifically, when the signal at the first input node In1 is fixed at "H", the FETs 26 and 27 can be omitted; when the signal at the second input node In2 is fixed at "H" the FETs 33 and 34 can be omitted.

Similarly, in the case of the NOR circuit, either a pair of the FETs 46 and 47, or the FETs 53 and 54 can be omitted. More specifically, when the signal at the first input node In1 is fixed at "L", the FETs 46 and 47 can be omitted; when the signal at the second input node In2 is fixed at "L", the FETs 53 and 54 can be omitted.

Figure 18:
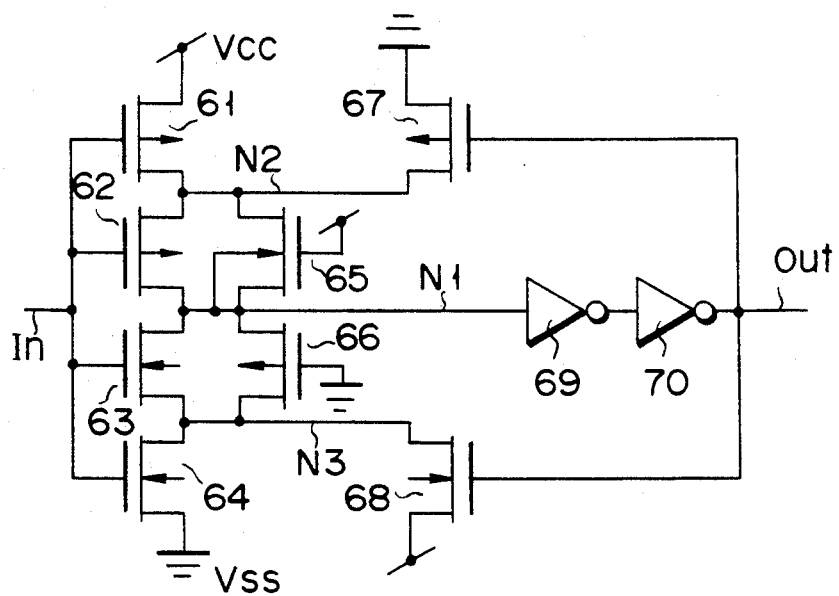
FIG. 18 is a circuit diagram of a CMOS type Schmitt trigger circuit according to the sixth embodiment of the present invention.

FIG. 18 is a circuit diagram of the sixth embodiment of the present invention in which the input circuit of the present invention is applied to a Schmitt trigger circuit. The source-drain paths of two p-channel MOSFETs 61 and 62 are connected in series between the node of a power source voltage Vcc and a node N1. The source-drain paths of two n-channel MOSFETs 63 and 64 are connected in series between the node N1 and the node of a ground voltage Vss. The gates of the FETs 61, 62, 63, and 64 are commonly connected to an input node In.

The source-drain path of an n-channel MOSFET 65 is connected in parallel to that of the FET 62, and the gate of the FET 65 is connected to the node of the power source voltage Vcc. The source-drain path of a p-channel MOSFET 66 is connected in parallel to that of the FET 63, and the gate of the FET 66 is connected to the node of the ground voltage Vss. The source-drain path of a p-channel MOSFET 67 is connected between a node N2 of the FETs 61 and 62 and the node of the ground voltage Vss. The source-drain path of an n-channel MOSFET 68 is connected between a node N3 of the FETs 63 and 64 and the node of the power source voltage Vcc.

The node N1 is connected to the input terminal of an inverter 69, and the output terminal of the inverter 69 is connected to the input terminal of an inverter 70. The output terminal of the inverter 70 is connected to an output node Out. The gates of the FETs 67 and 68 are connected to the output node Out.

In the circuit of the sixth embodiment, the element size and the like are set such that the ON resistance of each of the FETs 62, 63, 65, and 66 during the ON operation becomes twice that of the FETs 61, 64, 67, and 68.

Figure 7:
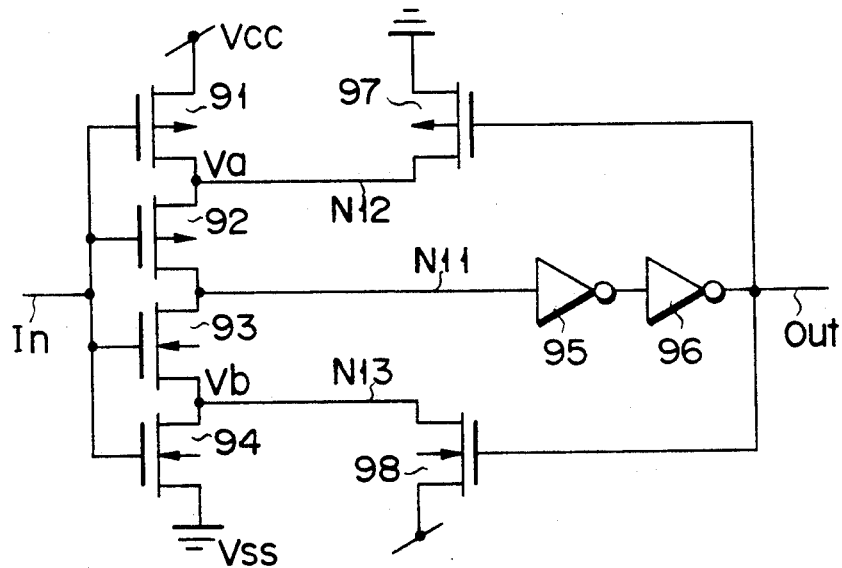
FIG. 7 is a circuit diagram of a conventional CMOS type Schmitt trigger circuit.

In the Schmitt trigger circuit having the above configuration, the n-channel MOSFET 65 and the p-channel MOSFET 66 are added to the conventional circuit of FIG. 7. When the p-channel FET 62 is turned on, its source-drain resistance becomes the parallel resistance of its ON resistance and the ON resistance of the n-channel FET 65 connected in parallel thereto. On the other hand, when the n-channel FET 63 is turned on, its source-drain resistance becomes the parallel resistance of its ON resistance and the ON resistance of the p-channel FET 66 connected in parallel thereto. As a result, even when the threshold voltage of an n-channel FET and that of a p-channel FET vary complementarily to each other during the manufacture, the resistance across the nodes N1 and N2 and that across the nodes N1 and N3 can be set close to a designed value, thereby suppressing a variation in circuit threshold voltage.

An explanation will be given as to the degree at which a variation in threshold voltage of the circuit of the sixth embodiment is improved compared to the case of the conventional circuit.

Figure 19:
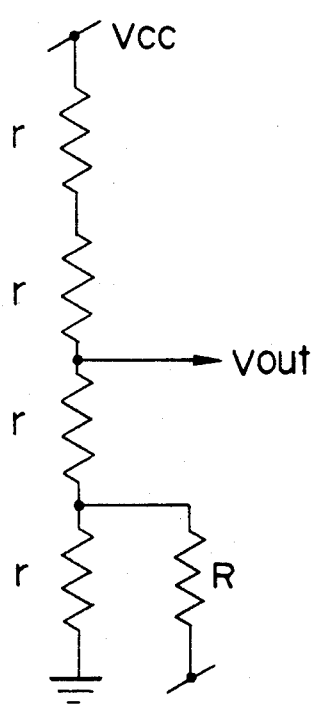

FIG. 19 shows an equivalent circuit of the conventional circuit shown in FIG. 7 of a case in which an input signal potential reaches ($\frac{1}{2}$)Vcc while the signal at the input node In changes from "L" to "H". In this case, assume that the ON resistance of each of the FETs 91 to 94 is r and that the ON resistance of each of the FETs 97 and 98 is R. The output signal potential Vout of the equivalent circuit of FIG. 19 is defined by the following equation (7):

$$Vout(1) = \left\{ \frac{r + r//R}{3r + R//R} + \frac{r}{2\left(R + \frac{3}{4}r\right)} \right\} \cdot Vcc \quad (7)$$

where r//R is the parallel resistance of r and R. Note that "//" indicates the parallel resistance of the resistances on the both sides of this symbol.

Figure 20:
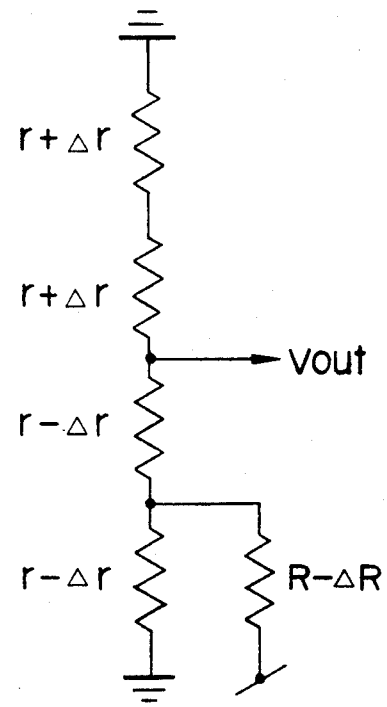

FIG. 20 is an equivalent circuit of the conventional circuit shown in FIG. 7 in which the ON resistances of the p-channel FETs 91 and 92 are changed from r to r + $\Delta$r, those of the n-channel FETs 93 and 94 are changed from r to r − $\Delta$r, and those of the FETs 97 and 98 are changed from R to R − $\Delta$R. The output signal potential Vout(2) of the equivalent circuit of FIG. 20 is defined by the following equation (8):

$$Vout(2) = \left\{ \frac{r - \Delta r + (r - \Delta r)//(R - \Delta R)}{3r + \Delta r + (r - \Delta r)//(R - \Delta R)} + \frac{1}{R - \Delta R + (3R + \Delta R)//(r - \Delta r)} \cdot \frac{r - \Delta r}{4r} \cdot 2(r + \Delta r) \right\} \cdot Vcc \quad (8)$$

FIG. 21 shows an equivalent circuit of a case in which the ON resistances of the p-channel FETs 91 and 92 are changed from r to r − $\Delta$r, those of the n-channel FETs 93 and 94 are changed from r to r + $\Delta$r, and those of the FETs 97 and 98 are changed from R to R + $\Delta$R. The output signal potential Vout(3) of the equivalent circuit of FIG. 21 is defined by the following equation (9):

$$Vout(3) = \left\{ \frac{r + \Delta r + (r + \Delta r)//(R + \Delta R)}{3r - \Delta r + (r + \Delta r)//(R + \Delta R)} + \frac{1}{R + \Delta R + (3r - \Delta r)//(r + \Delta r)} \cdot \frac{r + \Delta r}{4r} \cdot 2(r - \Delta r) \right\} \cdot Vcc \quad (9)$$

FIG. 22 shows an equivalent circuit of the conventional circuit of FIG. 7 in which the input signal potential reaches ($\frac{1}{2}$)Vcc while the signal at the input node In changes from "H" to "L" contrary to the above case. The output signal potential (4) is defined by the following equation (10):

$$Vout(4) = \frac{Vcc}{r + 3r//R} \cdot \frac{R}{3r + R} \cdot 2r \quad (10)$$

FIG. 23 shows an equivalent circuit of a case in which the ON resistances of the p-channel FETs 91 and 92 are changed from r to r + $\Delta$r, those of the n-channel FETs 93 and 94 are changed from r to r − $\Delta$r, and those of the FETs 97 and 98 are changed from R to R + $\Delta$R. The output signal potential Vout(5) of the equivalent circuit in FIG. 23 is defined by the following equation (11):

$$Vout(5) = \frac{Vcc}{r + \Delta r + (3r - \Delta r)//(R + \Delta R)} \cdot \frac{R + \Delta R}{3r - \Delta r + R + \Delta R} \cdot 2(r - \Delta R) \quad (11)$$

FIG. 24 shows an equivalent circuit of a case in which the ON resistances of the p-channel FETs 91 and 92 are changed from r to r − $\Delta$r, those of the n-channel FETs 93 and 94 are changed from r to r + $\Delta$r, and those of the FETs 97 and 98 are changed from R to R − $\Delta$R. The output signal potential Vout(6) of the equivalent circuit of FIG. 24 is defined by the following equation (12):

$$Vout(6) = \frac{Vcc}{r - \Delta r + (3r + \Delta r)//(R - \Delta R)} \cdot \frac{R - \Delta R}{3r + \Delta r + R + \Delta R} \cdot 2(r + \Delta R) \quad (12)$$

Figure 25:
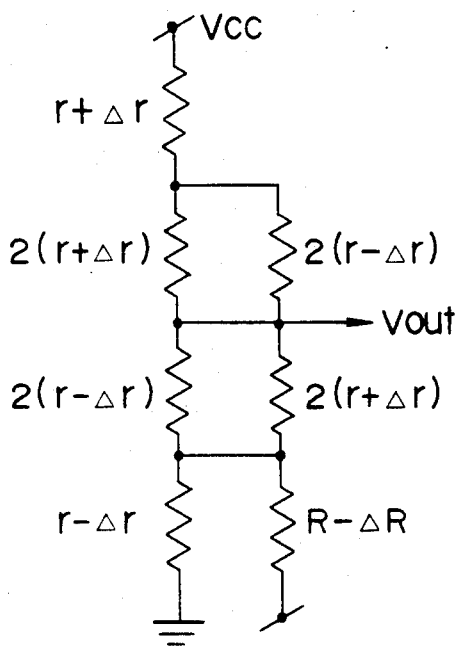
FIGS. 25 to 28 are equivalent circuit diagrams of the CMOS type Schmitt trigger circuit shown in FIG. 18.

In contrast to this, in the Schmitt trigger circuit of the sixth embodiment, assume that each FET is manufactured such that its ON resistance is equal to the designed value. In this case, when the input signal potential reaches to ($\frac{1}{2}$)Vcc while the signal at the input node In changes from "L" to "H", the output signal potential becomes the same as Vout(1) of equation (7). FIG. 25 shows an equivalent circuit of the Schmitt trigger circuit of the sixth embodiment of a following case. Namely, the ON resistance of the p-channel FET 61 is changed from r to r + Δr, those of the p-channel FETs and 66 are changed from 2r to 2(r + Δr), those of the n-channel FETs 63 and 65 are changed from 2r to 2(r − Δr), that of the n-channel FET 64 is changed from r to r − Δr, and that of the n-channel FET 68 is changed from R to R − ΔR. The output signal potential Vout(7) of this equivalent circuit is defined by the following equation (13):

$$Vout(7) = \left\{ \frac{r - \frac{\Delta r^2}{r} + (r - \Delta r)//(R - \Delta R)}{3r + \Delta r - 2\frac{\Delta r^2}{r} + (r - \Delta r)//(R - \Delta R)} + \right.$$

$$\frac{1}{R - \Delta R + \left(3r + \Delta r - 2\frac{\Delta r^2}{r}\right)//(r - \Delta r)} \times$$

$$\left. \frac{r - \Delta r}{4r - 2\frac{\Delta r^2}{r}} \times 2\left(r + \frac{\Delta r}{2} - \frac{\Delta r^2}{2r}\right) \right\} Vcc \quad (13)$$

Substitutions of $$3r + \Delta r >> 2\frac{\Delta r^2}{2}, 4r >> 2\frac{\Delta r^2}{r}$$

into equation (13) yield the following equation (14):

$$Vout(7) = \left\{ \frac{r - \frac{\Delta r^2}{2} + (r - \Delta r)//(R - \Delta R)}{3r + \Delta r + (r - \Delta r)//(R - \Delta R)} + \right.$$

$$\frac{1}{R - \Delta R + (3r + \Delta r)//(r - \Delta r)} \times$$

$$\left. \frac{r - \Delta r}{4r} \times 2\left(r + \frac{\Delta r}{2} - \frac{\Delta r^2}{2r}\right) \right\} Vcc \quad (14)$$

Figure 26:
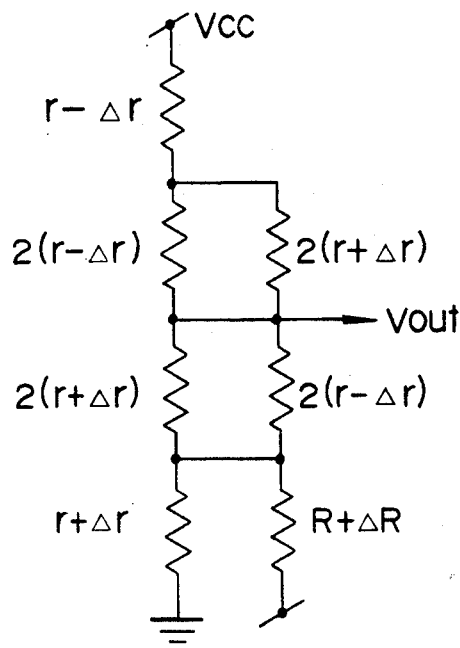

FIG. 26 shows an equivalent circuit of the Schmitt trigger circuit of the sixth embodiment described above of a case as follows. Namely, the ON resistance of the p-channel FET 61 is changed from r to r − Δr, those of the p-channel FETs 62 and 66 are changed from 2r to 2(r −Δr), those of the n-channel FETs 63 and 65 are changed from 2r to 2(r +Δr), that of the n-channel FET 64 is changed from r to r + Δr, and that of the n-channel FET 68 is changed from R to R + ΔR. The output signal potential Vout(8) of this equivalent circuit is defined by the following equation (15):

$$Vout(8) = \left\{ \frac{r - \frac{\Delta r^2}{r} + (r + \Delta r)//(R + \Delta R)}{3r - \Delta r - 2\frac{\Delta r^2}{r} + (r + \Delta r)//(R + \Delta R)} + \right. \quad (15)$$

$$\frac{1}{R + \Delta R + \left(3r - \Delta r - 2\frac{\Delta r^2}{3}\right)//(r + \Delta r)} \times$$

$$\left. \frac{r + \Delta r}{4r - 2\frac{\Delta r^2}{r}} \times 2\left(r - \frac{\Delta r}{2} - \frac{\Delta r^2}{2r}\right) \right\} Vcc$$

Substitutions of $$3r - \Delta r >> 2\frac{\Delta r^2}{2}, 4r >> 2\frac{\Delta r^2}{r}$$

into equation (15) yield the following equation (16):

$$Vout(8) = \left\{ \frac{r - \frac{\Delta r^2}{r} + (r + \Delta r)//(R + \Delta R)}{3r - \Delta r + (r + \Delta r)//(R - \Delta R)} + \right. \quad (16)$$

$$\frac{1}{R + \Delta R + (3r - \Delta r)//(r - \Delta r)} \times$$

$$\left. \frac{r + \Delta r}{4r} \times 2\left(r - \frac{\Delta r}{2} - \frac{\Delta r^2}{2r}\right) \right\} Vcc$$

Figure 27:
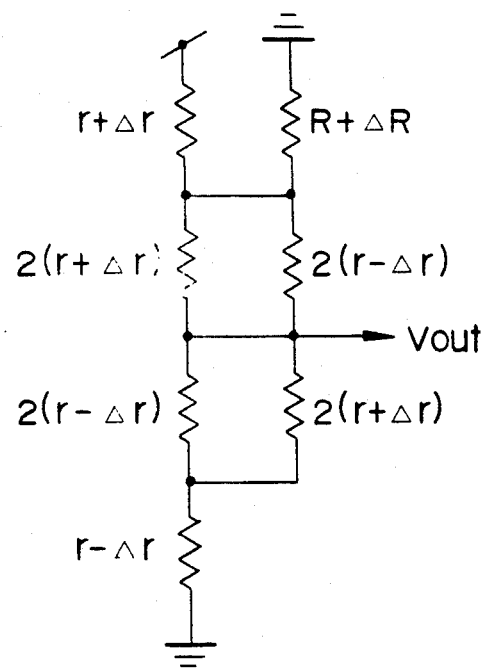

In the Schmitt trigger circuit of the sixth embodiment described above, assume that each FET is manufactured such that its ON resistance becomes equal to the designed value. In this case, when the input signal potential reaches ($\frac{1}{2}$)Vcc while the signal at the input node In changes from "H" to "L", the output signal potential becomes equal to Vout(4) of equation (10). FIG. 27 shows an equivalent circuit of the Schmitt trigger circuit of the sixth embodiment described above in the following case. Namely, the ON resistances of the p-channel FETs 62 and 66 are changed from r to r + Δr, those of the n-channel FETs 63 and 65 are changed from 2r to 2(r − Δr), that of the n-channel FET 64 is changed from r to r − Δr, and that of the p-channel FET 67 is changed from R to R + ΔR. The output signal potential Vout(9) of this equivalent circuit is defined by the following equation (17):

$$Vout(9) = \frac{Vcc}{r + \Delta r + \left(3r - \Delta r - 2\frac{\Delta r^2}{r}\right)//(R + \Delta R)} \times \quad (17)$$

$$\frac{R + \Delta R}{3r - \Delta r - 2\frac{\Delta r^2}{r} + R + \Delta R} \times 2\left(r - \frac{\Delta r}{2} - \frac{\Delta r^2}{2r}\right)$$

A substitution of $$3r - \Delta r >> 2\frac{\Delta r^2}{r}$$

into equation (17) yields the following equation (18):

$$Vout(9) = \frac{Vcc}{r + \Delta r + (3r - \Delta r)//(R + \Delta R)} \times \quad (18)$$

-continued $$\frac{R + \Delta R}{3r - \Delta r + R + \Delta R} \times 2\left(r - \frac{\Delta r}{2} - \frac{\Delta r^2}{2r}\right)$$

Figure 28:
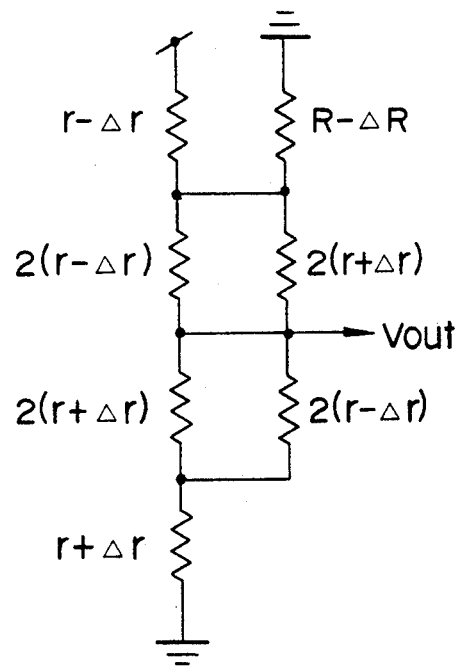

FIG. 28 shows an equivalent circuit of the Schmitt trigger circuit of the sixth embodiment described above in the following case. Namely, the ON resistance of the p-channel FET 61 is changed from r to r − Δr, those of the p-channel FETs 62 and 66 are changed from 2r to 2(r − Δr), those of the n-channel FETs 63 and 65 are changed from 2r to 2(r + Δr), that of the n-channel FET 64 is changed from r to r + Δr, and that of the p-channel FET 67 is changed from R to R − ΔR. The output signal potential Vout(10) of this equivalent circuit is defined by the following equation (10):

$$Vout(10) = \frac{Vcc}{r - \Delta r + \left(3r + \Delta r - 2\frac{\Delta r^2}{r}\right)//(R - \Delta R)} \times \quad (19)$$

$$\frac{R - \Delta R}{3r - \Delta r - 2\frac{\Delta r^2}{r} - R - \Delta R} \times 2\left(r - \frac{\Delta r}{2} - \frac{\Delta r^2}{2r}\right)$$

A substitution of $$3r - \Delta r >> 2\frac{\Delta r^2}{r}$$

into equation (19) yields the following equation (20):

$$Vout(10) = \frac{Vcc}{r - \Delta r + (3r + \Delta r)//(R - \Delta R)} \times \quad (20)$$

$$\frac{R - \Delta R}{3r - \Delta r + R - \Delta R} \times 2\left(r + \frac{\Delta r}{2} - \frac{\Delta r^2}{2r}\right)$$

In the conventional circuit, the difference between equations (8) and (9) of the conventional circuit with reference to equation (7), and the difference between equations (14) and (16) are compared. It is understood that a variation in output signal potential is smaller in the circuit of the sixth embodiment than in the conventional circuit.

Assume that the value of r is 10 Ω, that of Δr is 1 Ω, that of R is 20 Ω, and that of ΔR is 2 Ω. In this case, the value of equation (7) is about 0.63 Vcc. The value of equation (8) becomes about 0.60 Vcc, and that of equation (9) becomes about 0.67 Vcc. In contrast to this, the value of equation (14) becomes about 0.62 Vcc, and that of equation (16) becomes about 0.65 Vcc. In this case, the difference between equations (7) and (8) is 0.03 Vcc, whereas that between equations (7) and (14) is 0.01 Vcc. The difference between equations (7) and (9) is 0.04 Vcc, whereas that between equations (7) and (16) is 0.02 Vcc.

Similarly, the difference between equations (11) and (12) of the conventional circuit with reference to equation (10), and the difference between equations (18) and (20) of the circuit of the sixth embodiment will be compared. It is understood that a variation in output potential is smaller in the circuit of the sixth embodiment than in the conventional circuit. For example, assume that the value of r is 10 Ω, that of Δr is 1 Ω, that of R is 20 Ω, and that of ΔR is 2 Ω. In this case, the value of equation (10) is about 0.36 Vcc. The value of equation (11) becomes about 0.33 Vcc, and that of equation (12) becomes about 0.40 Vcc. In contrast to this, the value of equation (18) becomes about 0.35 Vcc, and that of equation (20) becomes about 0.38 Vcc. In this case, the difference between equations (10) and (11) is 0.03 Vcc, whereas that between equations (10) and (18) is 0.01 Vcc. Similarly, the difference between equations (10) and (12) is 0.04 Vcc, whereas that between equations (10) and (20) is 0.02 Vcc. In other words, in the circuit of the sixth embodiment, a variation in ON resistance of an FET is suppressed, and an effect to absorb a variation in circuit threshold voltage is obtained.

Figure 29:
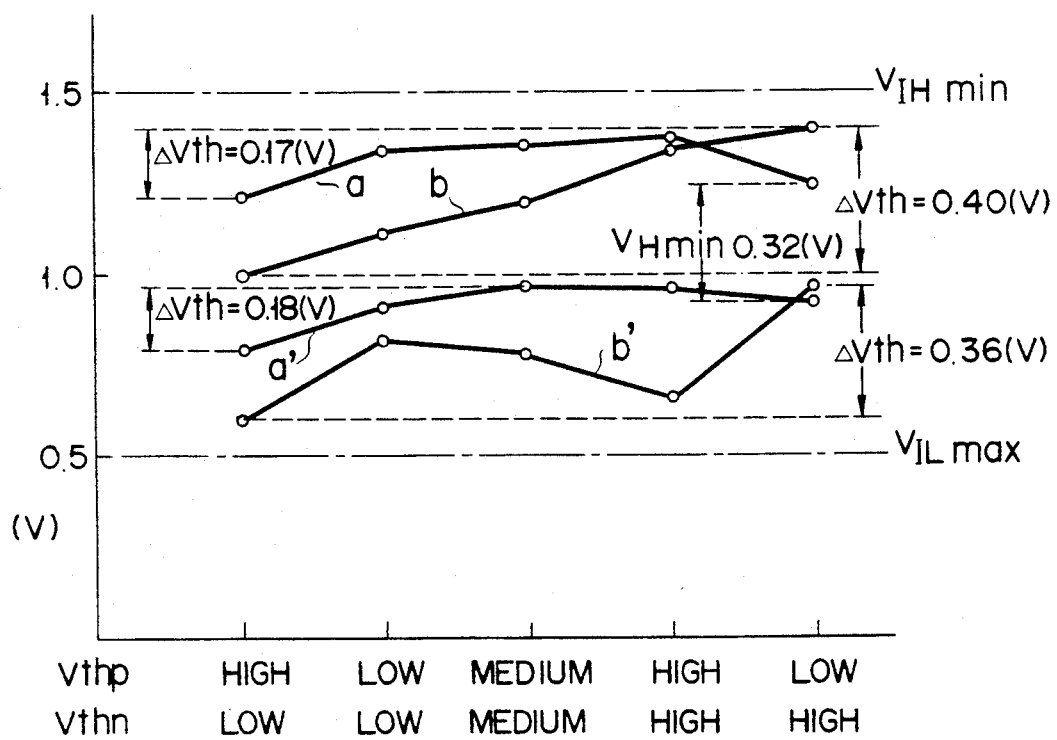

FIG. 29 is a graph of a change in circuit threshold voltage VthC of the following case. Namely, in this case, the Schmitt trigger circuit of the sixth embodiment and the conventional circuit shown in FIG. 7 are operated at a low power source voltage (Vcc=3V) while a threshold voltage VthP of a p-channel MOSFET and a threshold voltage VthN of an n-channel MOSFET are changed Characteristic curves a and a' represent values of the circuit of the sixth embodiment, and characteristic curves b and b' represent values of the conventional circuit. As shown in FIG. 29, a variation in circuit threshold voltage in a low-voltage operation is suppressed to 0.18V in the sixth embodiment compared to 0.40V of the conventional circuit. The hysteresis voltage width (VHmin) is increased to 0.32V in the sixth embodiment compared to 0.29V of the conventional circuit. Similarly, FIG. 30 is a graph of a change in circuit threshold voltage VthC of a case as follows. Namely, the Schmitt trigger circuit of the sixth embodiment and the conventional circuit shown in FIG. 7 are operated at a high power source voltage (Vcc=5V) while the threshold voltage VthN of a p-channel FET and the threshold voltage VthN of an n-channel FET are changed. Characteristic curves a and a' represent values of the circuit of the sixth embodiment, and characteristic curves b and b' represent values of the conventional circuit. In this case, a variation (ΔVth) in circuit threshold voltage is suppressed to 0.30V in the sixth embodiment compared to conventional 0.45V. The hysteresis voltage width (VHmin) is also increased to 0.86V in the sixth embodiment compared to conventional 0.58V.

FIGS. 31 and 32 are circuit diagrams of Schmitt trigger circuits according to the seventh and eighth embodiments, respectively, of the present invention. The Schmitt trigger circuit of the seventh embodiment shown in FIG. 31 is obtained by removing the p-channel FET 66 from the circuit of the sixth embodiment shown in FIG. 18. In the circuit of the seventh embodiment, since an n-channel FET 65 is connected in parallel to the p-channel FET 62, a variation in ON resistance in the FET 62 is suppressed. Thus, only a variation in circuit threshold voltage when an input signal potential drops from "H" to "L" is suppressed. In contrast to this, in the circuit of the eighth embodiment shown in FIG. 32, the n-channel FET 65 is removed, and a p-channel FET 66 is connected in parallel to the n-channel FET 63. As a result, a variation in ON resistance of the FET 63 is suppressed, and a variation in circuit threshold voltage upon a change in input signal potential from "L" to "H" is suppressed.

FIG. 33 is a circuit diagram of the ninth embodiment of the present invention in which the input circuit of the present invention is applied to a Schmitt trigger circuit.

In the circuit of sixth embodiment shown in FIG. 18, the gates of the n- and p-channel FETs 65 and 66 are connected to the node of the power source voltage Vcc and the node of the ground voltage Vss, respectively. However, in the ninth embodiment, these gates are commonly connected to the output node Out. In the circuit of the ninth embodiment, when the p-channel FET 62 is turned on, an input signal potential is "L", the node N1 is "H", and the potential at the output node Out as the output terminal of the inverter 70 is "H". As a result, the n-channel FET 65 is turned on, and the resistance across the nodes N2 and N1 becomes the parallel resistance of the FETs 62 and 65. On the other hand, when the n-channel FET 63 is turned on, the p-channel FET 66 is also turned on, and the resistance across the nodes N1 and N3 becomes the parallel resistance of the FETs 63 and 66.

FIG. 34 is a circuit diagram of a Schmitt trigger circuit according to the tenth embodiment of the present invention. The circuit of the tenth embodiment is obtained by removing the p-channel FET 66 from the circuit of FIG. 33, as in the circuit shown in FIG. 31. As a result, only a variation in circuit threshold voltage upon a change in input signal potential from "H" to "L" is suppressed.

FIG. 35 is a circuit diagram of a Schmitt trigger circuit according to the eleventh embodiment of the present invention. The circuit of the eleventh embodiment is obtained by removing the n-channel FET 65 from the circuit of FIG. 33, as in the circuit of FIG. 32. As a result, only a variation in circuit threshold voltage upon a change in input signal potential from "L" to "H" is suppressed FIG. 36 is a circuit diagram of the twelfth embodiment of the present invention in which the input circuit of the present invention is applied to a Schmitt trigger circuit. In the circuit of the twelfth embodiment, the two inverters 69 and 70 of the circuit of the sixth embodiment shown in FIG. 18 are removed, and the node N1 is directly connected to the output node Out.

FIG. 37 is a circuit diagram of a Schmitt trigger circuit according to the thirteenth embodiment of the present invention. In the circuit of the thirteenth embodiment, the p-channel FET 66 of the circuit of FIG. 36 is removed.

FIG. 38 is a circuit diagram of a Schmitt trigger circuit according to the fourteenth embodiment of the present invention. In the circuit of the fourteenth embodiment, the n-channel FET 65 of the circuit of FIG. 36 is removed, as in the embodiment of FIG. 32.

FIG. 39 is a circuit diagram of the fifteenth embodiment of the present invention in which the MOS type input circuit of the present invention is applied to a Schmitt trigger circuit. In the fifteenth embodiment, the two inverters 69 and 70 of the circuit of the ninth embodiment shown in FIG. 33 are removed, and the node N1 is directly connected to the output node Out. FIGS. 40 and 41 are circuits diagrams of Schmitt trigger circuits according to the sixteenth and seventeenth embodiments, respectively, of the present invention. In the circuit of FIG. 40, the p-channel FET 66 of the circuit of FIG. 39 is removed. In the circuit of FIG. 41, the n-channel FET 65 of the circuit of FIG. 39 is removed.

As has been described above, according to the present invention, there is provided a MOS type input circuit which can suppress a variation in circuit threshold voltage accompanying a variation in threshold voltage of an FET better than in a conventional circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A CMOS type input circuit comprising:
 a first node for receiving a first power source voltage;
 a second node for receiving a second power source voltage;
 a third node for outputting a signal;
 a first MOSFET of a first channel type having a gate and a source-drain path having a first end coupled to said first node, and a second end;
 a second MOSFET of the first channel type having a gate, and a source-drain path having a first end coupled to the second end of said source-drain path of said first MOSFET, and a second end coupled to said third node;
 a third MOSFET of a second channel type having a gate and a source-drain path having a first end coupled to said second node, and a second end;
 a fourth MOSFET of the second channel type having a gate and a source-drain path having a first end coupled to the second end of said source-drain path of said third MOSFET, and a second end coupled to said third node; and
 a fifth MOSFET of the second channel type having a gate coupled to said first node, and a source-drain path coupled in parallel to said source-drain path of said second MOSFET.

2. A CMOS type input circuit according to claim 1, further comprising a sixth MOSFET of the first channel type, having a gate coupled to the second node, and a source-drain path coupled in parallel to said source-drain path of said fourth MOSFET.

3. A CMOS type input circuit according to claim 2, wherein said gates of said first, second, third, and fourth MOSFETs are coupled together.

4. A CMOS type input circuit according to claim 1, wherein the first node includes
 means for receiving a first power source voltage having value such that the fifth MOS operates in a normally conductive state.

5. A CMOS type input circuit according to claim 2, wherein the second node includes
 means for receiving a second power source voltage having a value such that sixth MOS operates in a normally conductive state.

6. A CMOS type input circuit comprising:
 a first node for receiving a first power source voltage;
 a second node for receiving a second power source voltage;
 a third node for outputting a signal;
 a first MOSFET of a first channel type having a gate and a source-drain path having a first end coupled to said first node, and a second end;
 a second MOSFET of the first channel type having a gate, and a source-drain path having a first end coupled to the second end of said source-drain path of said first MOSFET, and a second end coupled to said third node;
 a third MOSFET of a second channel type having a gate, and a source-drain path having a first end coupled to said second node, and a second end;

a fourth MOSFET of the second channel type having a gate, and a source-drain path having a first end coupled to the second end of said source-drain path of said third MOSFET, and a second end coupled to said third node; and a fifth MOSFET of the second channel type having a gate, and a source-drain path coupled in parallel to said source-drain path of said second MOSFET.

a sixth MOSFET of the first channel type, having a gate, and a source-drain path coupled in parallel to said source-drain path of said third MOSFET.

a seventh MOSFET of the second channel type having a gate, and a source-drain path coupled between said first end of said source-drain path of said third MOSFET and said second node;

an eighth MOSFET of the first channel type having a gate, and a source-drain path having a first end coupled to said first node, and a second end;

a ninth MOSFET of the first channel type having a gate, and a source-drain path having a first end coupled to the second end of said source-drain path of said eighth MOSFET, and a second end coupled to said third node;

a tenth MOSFET of the second channel type having a gate, and a source-drain path having a first end coupled to said second node, and a second end;

an eleventh MOSFET of the second channel type having a gate, and a source-drain path having a first end coupled to the second end of said source-drain path of said tenth MOSFET, and a second end;

a twelfth MOSFET of the second channel type having a gate, and a source-drain path having a first end coupled to the second end of said source-drain path of said eleventh MOSFET, and a second end coupled to said third node;

a thirteenth MOSFET of the second channel type having a gate, and a source-drain path coupled in parallel to said source-drain path of said ninth MOSFET; and a fourteenth MOSFET of the first channel type having a gate, and a source-drain path coupled in parallel to said source-drain path of said twelfth MOSFET.

7. A CMOS type input circuit according to claim 6, wherein said gates of said first, second, third, fourth, and tenth MOSFETs are coupled together, and said gates of said seventh, eight, ninth, eleventh, and twelfth MOSFETs are coupled together.

8. A CMOS type input circuit according to claim 7, wherein said gates of said fifth and thirteenth MOSFETs are coupled to said first node, and said gates of said sixth and fourteenth MOSFETs are coupled to said second node.

9. A CMOS type input circuit according to claim 6, wherein said gates of said first, second, fourth, seventh, and tenth MOSFETs are coupled together, and said gates of said third, eighth, tenth, and twelfth MOSFETs are coupled together.

10. A CMOS type input circuit according to claim 9, wherein said gates of said fifth and thirteenth MOSFETs are coupled to said first node, and said gates of said sixth and fourteenth MOSFETs are coupled to said second node.

11. A CMOS type input circuit comprising:
a first node for receiving a first power source voltage;
a second node for receiving a second power source voltage;
a third node for outputting a signal;
a first MOSFET of a first channel type having a gate and a source-drain path having a first end coupled to said first node, and a second end;

a second MOSFET of the first channel type having a gate, and a source-drain path having a first end coupled to the second end of said source-drain path of said first MOSFET, and a second end coupled to said third node;

a third MOSFET of a second channel type having a gate, and a source-drain path having a first end coupled to said second node, and a second end;

a fourth MOSFET of a second channel type having a gate, and a source-drain path having a first end coupled to the second end of said source-drain path of said third MOSFET, and a second end coupled to said third node;

a fifth MOSFET of a second channel type having a gate, and a source-drain path coupled in parallel to said source-drain path of said second MOSFET;

a sixth MOSFET of a second channel type having a gate, and a source-drain path coupled in parallel to said source-drain path of said third MOSFET;

a seventh MOSFET of the first channel type having a gate, and a source-drain path coupled between said first end of said source-drain path of said first MOSFET and said first node;

an eighth MOSFET of the first channel type having a gate, and a source-drain path having a first end coupled to said first node, and a second end;

a ninth MOSFET of the first channel type having a gate, and a source-drain path having a first end coupled to the second end of said source-drain path of said eighth MOSFET, and a second end;

a tenth MOSFET of the first channel type having a gate, and a source-drain path having a first end coupled to the second end of said source-drain path of said ninth MOSFET, and a second end coupled to said third node;

an eleventh MOSFET of a second channel type having a gate, and a source-drain path having a first end coupled to said second node, and a second end;

a twelfth MOSFET of a second channel type having a gate, and a source-drain path having a first end coupled to the second end of said source-drain path of said eleventh MOSFET, and a second end coupled to said third node;

a thirteenth MOSFET of the second channel type having a gate, and a source-drain path coupled in parallel to said source-drain path of said tenth MOSFET; and a fourteenth MOSFET of the first channel type having a gate, and a source-drain path coupled in parallel to said source-drain path of said twelfth MOSFET.

12. A CMOS type input circuit according to claim 11, wherein said gates of said first, second, third, fourth, and eighth MOSFETs are coupled together, and said gates of said seventh, ninth, tenth, eleventh, and twelfth MOSFETs are coupled together.

13. A CMOS type input circuit according to claim 12, wherein said gates of said fifth, and thirteenth MOSFETs are coupled to said first node, and said gates of said sixth and fourteenth MOSFETs are coupled to said second node.

14. A CMOS type input circuit according to claim 11, wherein said gates of said second, third, fourth, seventh, and ninth MOSFETs are coupled together, and said gates of said first, eighth, tenth, eleventh, and twelfth MOSFETs are coupled together.

15. A CMOS type input circuit according to claim 14, wherein said gates of said fifth and thirteenth MOSFETs are coupled to said first node, and said gates of said sixth and fourteenth MOSFETs are coupled to said second node.

16. A CMOS type input circuit comprising:
a first node for receiving a first power source voltage;
a second node for receiving a second power source voltage;
a third node for outputting a signal;
a first MOSFET of a first channel type having a gate and a source-drain path having a first end coupled to said first node, and a second end;
a second MOSFET of the first channel type having a gate, and a source-drain path having a first end coupled to the second end of said source-drain path of said first MOSFET, and a second end coupled to said third node;
a third MOSFET of a second channel type having a gate, and a source-drain path having a first end coupled to said second node, and a second end;
a fourth MOSFET of the second channel type having a gate, and a source-drain path having a first end coupled to the second end of said source-drain path of said third MOSFET, and a second end coupled to said third node;
a fifth MOSFET of the second channel type having a gate, and a source-drain path coupled in parallel to said source-drain path of said second MOSFET.
a sixth MOSFET of the first channel type, having a gate, and a source-drain path coupled between the second end of said source-drain path of said first MOSFET and said second node; and
a seventh MOSFET Of the second channel type having a gate, and a source-drain path coupled between the second end of said source-drain path of said fourth MOSFET and said first node.

17. A CMOS type input circuit according to claim 16, further comprising an eighth MOSFET of the first channel type having a gate, and a source-drain path coupled in parallel to said source-drain path of said third MOSFET.

18. A CMOS type input circuit according to claim 16, wherein said gates of said first, second, third, and fourth MOSFETs are coupled together, and said gates of said sixth and seventh MOSFETs are coupled to said third node.

19. A CMOS type input circuit according to claim 16, wherein said gate of said fifth MOSFET is coupled to said third node.

20. A CMOS type input circuit according to claim 17, wherein said gate of said fifth MOSFET is coupled to said first node and said gate of said eighth MOSFET is connected to said second node.

21. A CMOS type input circuit according to claim 17, wherein said gates of said fifth and eighth MOSFETs are coupled to said third node.

* * * * *

UNITED STATES PATENT AND TRADEMARK OFFICE
CERTIFICATE OF CORRECTION

PATENT NO. : 5,175,445
DATED : December 29, 1992
INVENTOR(S) : Masanori Kinugasa et al.

It is certified that error appears in the above-indentified patent and that said Letters Patent is hereby corrected as shown below:

Claim 6, column 19, line 5, delete, "and".

Claim 6, column 19, line 8, change "MOSFET." to --MOSFET;--.

Claim 6, column 19, line 11, change "MOSFET." to --MOSFET;--.

Claim 11, column 20, line 7, change "MOSFET , and" to --MOSFET, and--.

Claim 13, column 20, line 62, after "fifth", delete --,--.

UNITED STATES PATENT AND TRADEMARK OFFICE
CERTIFICATE OF CORRECTION

PATENT NO. : 5,175,445

DATED : December 29, 1992

INVENTOR(S) : Masanori Kinugasa et al

It is certified that error appears in the above-indentified patent and that said Letters Patent is hereby corrected as shown below:

Claim 16, column 22, line 3, change "MOSFET." to --MOSFET;--.

Signed and Sealed this

Twenty-second Day of February, 1994

Attest:

BRUCE LEHMAN

Attesting Officer        Commissioner of Patents and Trademarks